United States Patent
Tanaka et al.

(10) Patent No.: US 7,828,473 B2
(45) Date of Patent: Nov. 9, 2010

(54) ILLUMINATING APPARATUS AND DISPLAY APPARATUS USING THE SAME

(75) Inventors: Toshiaki Tanaka, Hitachi (JP); Hiroki Kaneko, Hitachi (JP); Ikuo Hiyama, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 0 days.

(21) Appl. No.: 11/265,122

(22) Filed: Nov. 3, 2005

(65) Prior Publication Data
US 2006/0092618 A1 May 4, 2006

(30) Foreign Application Priority Data
Nov. 4, 2004  (JP) .............................. 2004-320136

(51) Int. Cl.
*F21V 7/04* (2006.01)
(52) U.S. Cl. ........................................... 362/612
(58) Field of Classification Search ................. 362/612
See application file for complete search history.

(56) References Cited

U.S. PATENT DOCUMENTS

| | | | | |
|---|---|---|---|---|
| 5,020,066 A | * | 5/1991 | Iga et al. | 372/45.01 |
| 5,020,666 A | * | 6/1991 | Barlean | 206/376 |
| 5,157,468 A | * | 10/1992 | Matsumoto | 257/98 |
| 5,783,465 A | * | 7/1998 | Canning et al. | 438/119 |
| 6,014,164 A | * | 1/2000 | Woodgate et al. | 348/51 |
| 6,556,260 B1 | * | 4/2003 | Itou et al. | 349/69 |
| 6,617,606 B2 | * | 9/2003 | Nakatsu et al. | 257/14 |
| 7,278,775 B2 | * | 10/2007 | Yeo et al. | 362/615 |
| 2004/0042234 A1 | * | 3/2004 | Otake | 362/561 |
| 2006/0091412 A1 | * | 5/2006 | Wheatley et al. | 257/98 |
| 2006/0132725 A1 | | 6/2006 | Terada et al. | |
| 2006/0221270 A1 | * | 10/2006 | Ioki et al. | 349/61 |

FOREIGN PATENT DOCUMENTS

JP   A-55-166977   12/1980

(Continued)

OTHER PUBLICATIONS http://en.wiktionary.org/wiki/waveguide.*

(Continued)

*Primary Examiner*—Sandra L O'Shea
*Assistant Examiner*—William J Carter
(74) *Attorney, Agent, or Firm*—Antonelli, Terry, Stout & Kraus, LLP.

(57) ABSTRACT

A liquid crystal display (LCD) panel with a backlight module including a light-emitting diode (LED)-based illumination device is disclosed. The illumination device includes more than one LED of the waveguide type for use as a light source of the backlight. The LCD panel includes a pair of substrates, a liquid crystal (LC) layer interposed between these substrates, and a polarization plate. Output light of the LED is linearly polarized in advance. A waveguide is arranged for giving off polarized light components from the LED only in a chosen direction to thereby permit incidence in parallel with a polarized light transmission direction of the LCD polarizer plate. The LED is amounted and arranged so that the polarized light transmission direction of the polarizer plate is the same as the polarization direction through an optical system associated therewith.

18 Claims, 16 Drawing Sheets

FOREIGN PATENT DOCUMENTS

| | | |
|---|---|---|
| JP | A-1-128479 | 5/1989 |
| JP | A-4274375 | 9/1992 |
| JP | 8-306954 | 11/1996 |
| JP | A-8-316583 | 11/1996 |
| JP | A-9-246592 | 9/1997 |
| JP | 9-302107 | 11/1997 |
| JP | 2001-144326 | 5/2001 |
| JP | 2002-365634 | 12/2002 |
| JP | 2003-7114 | 1/2003 |
| JP | 2004-96132 | 3/2004 |
| JP | A-2004-220016 | 8/2004 |

OTHER PUBLICATIONS

Shuji Nakamura et al., "Superbright Green InGaN Single-Quantum-Well-Structure Light-Emitting Diodes", Jpn, J. Appl. Phys. vol. 34 (1995) pp. L1882-L1885.

Kaminow, I.P., et al; "Measurement of the Modal Reflectivity of an Antireflection Coating on a Superluminescent Diode," IEEE Journal of Quantum Electronics, vol. QE-19, No. 4, Apr. 1983, pp. 493-495.

Office Action in JP 2004-320136, drafted Sep. 25, 2009 (pp. 1-3, in Japanese).

Office Action in JP 2004-320136, drafted Jul. 6, 2010, (3 pages)[in Japanese].

* cited by examiner

ILLUMINATING APPARATUS AND DISPLAY APPARATUS USING THE SAME

CROSS-REFERENCE TO RELATED APPLICATION

The present application is related to U.S. Patent Application entitled "Lighting Source Unit, Illuminating Apparatus Using the Same and Display Apparatus Using the Same" in the name of Ikuo Hiyama, Hiroki Kaneko, Toshiaki Tanaka, Tsunenori Yamamoto, Akitoyo Konno, Katsumi Kondo and Haruo Akahoshi based on Japanese Patent Application No. 2004-320383 filed on Nov. 4, 2004, and U.S. Patent Application entitled "Illuminating Apparatus, Method for Fabricating the Same and Display Apparatus Using the Same" in the name of Hiroki Kaneko, Ikuo Hiyama, Toshiaki Tanaka, Masaya Adachi, Tsunenori Yamamoto and Haruo Akahoshi, based on Japanese Patent Application No. 2004-320409 filed on Nov. 4, 2004, and the contents of which are incorporated herein by reference.

BACKGROUND OF THE INVENTION

1. Field of the Invention

The present invention relates generally to flat panel display technologies and, more particularly, to thin display devices including, but not limited to, liquid crystal display (LCD) panels with a built-in backlight module.

2. Description of the Related Art

In display apparatus of the type using a liquid crystal (LC) panel representative of thin-type displays, an illuminating device is traditionally designed to use a cold cathode tube as the light source of a backlight module. In recent years, large screen size LCD television (TV) receivers using semiconductor light-emitting diode (LED) elements as the light source of its backlight are developed and commercially announced in the marketplace. Additionally, a light source of the backlight for use in small screen size LC panels for mobile cellular phones is typically designed to employ a white light source which is made up, in combination, of more than one blue-color semiconductor LED and yellow-color fluorescent material.

In the semiconductor LED elements (simply referred to also as "LEDs" hereinafter) used for these applications, these are conventionally arranged to be of the area light emission type capable of enlarging spread angles of outgoing light. An example of the LED-using illumination device is disclosed, for example, in S. Nakamura et al., Jpn. Journal of Appl. Phys., 34, L1332 (1995), wherein both electrodes for the power feed use are disposed on a one-side surface of the LED element to thereby attain the current-flowable area emission type for permitting the entire element to emit light, which is then taken out from the side of an optically transparent substrate.

In addition, an approach to improving the device characteristics of LEDs is disclosed in JP-A-2001-144326 and JP-A-2004-96132, wherein a technique for increasing the intensity of outgoing polarized light components as emitted from a light emission layer is used to enhance the efficiency of take-out of the emitted light to thereby increase the external quantum efficiency. Moreover, in order to make active use of polarized light components with respect to an LC panel, JP-A-8-306954 and JP-A-9-302107 involve therein the teachings as to a scheme for manufacturing an uniaxially oriented polymer which enhances the polarized light of a polymer organic light emissive device. Additionally, an illumination device of LC panel which uses in combination LEDs and a polarization plate(s) to guide illumination light to fall onto a light guide plate is known, examples of which are disclosed in JP-A-2002-365634 and JP-A-2003-7114.

SUMMARY OF THE INVENTION

LED elements are currently used for the light source of a backlight module for mobile phones. Furthermore, in recent years, LEDs come into use as the light source also in large-size LCD panels for use in monitors and TV sets, which have been designed to use cold cathode tubes as the backlight luminous sources thereof. Since prior known LEDs are such that illumination light (outgoing light) is emitted from the entirety of such LEDs to spread in the space in every direction, so the LEDs are featured in that the light is large in spread angle and exhibits uniform light emissivity. However, the current situation is such that once the light is guided to pass through a polarizer plate(s) of LC panel, the effectively utilizable part of the light leaving the LEDs is merely one-half of a total amount of the light released. This poses a problem which follows: the LEDs remain low in light use efficiency as a whole. Any one of the above-cited Japanese patent documents is silent about this problem. These documents fail to suggest the arrangements and effects unique to this invention as will be described later.

An object of the invention is to provide a high-efficiency/high-luminance light emissive device with improved light use efficiency of an entirety of light-emitting diode (LED) element and also provide a display apparatus using this light emission device as a backlight module thereof.

To attain the foregoing object, in this invention, a light emission layer and a waveguide path are specifically arranged to enable polarized light, which is capable of passing through a polarization plate of a liquid crystal (LC) panel making up a display apparatus, to be taken out strongly to thereby improve the light use efficiency of the entire light emission device.

Specific arrangements for improving the light use efficiency of light-emitting diode (LED) element for use as the backlight luminous source of the LC panel in the display apparatus will be set forth below.

In this invention, the light emission layer and waveguide are specifically prearranged in structure in such a way as to enable the polarized light to strongly radiate from more than one LED element in the polarized light transmission direction of a polarizer plate in the PC panel. Additionally the waveguide is specifically designed in structure to enable the outgoing light of the LED to expand in emitted light intensity distribution.

In the LED element of the invention, when forming the LED, firstly, a quantum well layer having its surface with biaxial compressive distortion introduced thereinto is repeatedly laminated in a light emissive layer to be provided on a substrate. Introducing the compressive distortion into the surface causes degeneracy of "heavy" and "light" hole bands of a valence band to disappear, resulting in fission. This leads to selective creation of recombination transition between holes of the heavy hole band and electrons of a conduction band for forming relatively a shallow energy band. Thus it is possible to take out or "extract" TE-polarized light, which is strongly polarized in parallel with the surface of the light emission layer.

In other words, it is possible to extract from the LED element the intended polarized light which is significantly polarized in parallel to the light emission layer and in a direction perpendicular to the LED's light output direction. When a waveguide structure made up of the light emission layer and light guide layer is arranged to emit such the unidirectionally wave-guided polarization light from two opposing end faces or alternatively from a single end face, it is possible to selectively output the polarized light which is strongly polarized in the parallel direction to the light emission layer in the direction of the waveguide path. Although in this case a reflective film is formed at the end face(s) for control of the reflectivity to thereby adjust a light output, it is possible to largely extract the light output from one-side end face only, by setting the reflectivity of a one-side end face to a small level while at the same time enlarging the reflectivity of an end face on the opposite side. By the specific waveguide structure and reflectivity control, it becomes possible to take out the polarized light of high power which is strongly polarized only in the required direction.

An explanation will next be given of an arrangement as introduced into an LED element having the waveguide structure in order to maximally expand its light intensity distribution. Usually, the waveguide structure is such that a light emission region is limited, so it is required to employ an arrangement for expanding the outgoing light distribution as large as possible. In order to expand it to an extent being greater than the light intensity distribution of the outgoing light from a linear waveguide, the invention employs an arrangement for causing the waveguide structure to have a widened effective light emission layer width of one-side end face for light output while designing the light emission layer width of the other end face so that this is shrunk to become extremely narrow and have another shape, thereby enabling extraction of a large amount of light output only from the one-side end face with the light emission layer width being widened. In this case, a low reflective film is formed on the one-side end face with the widened light emission layer width whereas a high reflective film is formed on the other end face with the light emissive layer width being narrowed, whereby high-power light output is obtainable only on the low reflective film-formed front face side.

With this waveguide structure setup, it is possible to obtain the LED element capable of emitting from its light output face the light with a wide light intensity distribution, when compared to linear waveguide paths. In addition, the front side coated with the low reflective film for use as the light output plane is arranged to have a convex-like curved plane while the rear face coated with the high reflective film is designed to have a concave-like curved plane. With this arrangement also, it is possible to obtain the LED element capable of emitting from its light output face the intended light with enhanced light intensity distribution.

Next, an explanation will be given of some features when the LED element with strong polarizability is applied to an LC panel display apparatus in this invention. In the display apparatus using an LC panel, a diffusion film or diffuser plate is used in order to maximally expand the illumination light of a backlight module. This diffuser film or plate contains therein ultrafine particles for light scatter purposes. This raises apprehension about risks which follow: incident polarized light components behave to scatter and diffuse causing the original polarized components to be hardly conserved with intact nature whereby the polarization ratio becomes smaller so that the light becomes randomly scattered light. Regarding polarized light components with less polarization ratios, these become random scattered light rays at the diffuser film or plate so that about half of the entire light is merely useable as the effective polarized light components at the polarizer plate in LC panel.

To permit effective use of the polarized light components passing through the polarizer plate of LC panel, it is desirable that the polarization ratio be at least 10 or greater. By letting it have polarized light components of large polarization ratios, it becomes possible to largely retain the polarized light components that travel in the polarized light transmission direction even after passed through the diffuser film or plate as provided between the LED element and LC panel. If the polarization ratio remains least two times greater or more after penetration of the diffuser film or plate, it is possible to retain the light use efficiency which is at least 1.3 times larger than that in the case of random light.

Actually, when looking at through a diffuser film for use in mobile phones having a thickness of 0.1 to 0.2 mm, it is possible for this invention to maintain the polarization ratio of about 480, while the use efficiency of the light that is effectively utilizable by transmission of the polarizer plate of LC panel exhibits about 1.99 against random light. Additionally in TV-use LCD panels, the illumination area of backlight is large, so it is required to increase the distance between the diffuser plate and LED element in order to sufficiently utilize diffusion effects of the light. As the polarization ratio decreases undesirably in a way depending upon the distance between the diffuser plate and LED, it was necessary to evaluate a decrease in the polarization ratio.

When looking at through a 2-mm thick diffuser plate for use in LCD TV sets, the polarization ratio of about 23 is maintainable when the distance between it and the LED element of the invention measures 10 mm; when the distance is set to 20 mm, the polarization ratio of 8 was retained. Accordingly, the use efficiency of the light that is effectively utilizable by penetration of the LC panel's polarizer plate becomes about 1.92 and 1.78 for random light, respectively. By using these designs to construct the LED with enhanced polarizability as the backlight module of the LC panel-using display apparatus, it is possible to improve the light use efficiency of the light source to approximately two times greater than ever before, even when the light is guided to pass through the diffuser film or plate.

This suggests that the use of the illumination device using the LED element of this invention brings an effect equivalent to the capability of maintaining the same light amount even when reducing the power consumption of the LC panel backlight luminous source. It also means that there is an effect equivalent to reduction in number of LEDs to be required as the backlight to attain the same light amount in display apparatus using prior art LC panels.

An explanation will be given of a parts-mounting form of the LED element of the invention for use as the backlight luminous source in the LC panel-using display apparatus. In a mobile phone-use backlight, the outgoing light of LED elements is guided to pass through a light guide plate and is then taken out on the upper surface side while letting the light spread in the space. In this event, the LED output light is used only in a single direction for incidence onto the light guide plate, resulting in light being extracted on the upper face side, which is then guided to pass through the polarizer plate of LC panel. The arrangement of the LED equipped with the waveguide in this invention is well suited thereto. By enabling certain polarized light components with enhanced polarizability only in a single direction of one-side end face to exit outward at high output levels, these are capable of entering the light guide plate while at the same time conserving the polarized light components on the upper face side to thereby permit introduction into the polarizer plate of LC panel.

In addition, as the mobile phone-use backlight is designed to use a plurality of LEDs, it is possible to compensate for the polarized light intensity in areas or zones in which light emission distributions overlap each other. This ensures that in the light distribution zones being extensively irradiated by a plurality of LEDs, almost uniformly polarized light is obtainable over the entire surface. This is advantageously devoted to obtaining uniform illumination over a large surface area.

An explanation will next be given of an arrangement for enabling achievement of uniform illumination over a large area by specifically designing the mounting scheme of LED elements in such a way as to provide the applicability to the backlight for the large-screen LCD TV sets also. Although the backlight as used in such LCD TVs is large in illumination area and thus it is required to enlarge the distance between a diffuser plate and LEDs in order to permit the light to sufficiently diffuse over the large area and also to obtain sufficient color mixture of red, green and blue (RGB) three-color LEDs, it is also important from a viewpoint of the quest for thinner panels to mount the LEDs while minimizing the LED/diffuser distance.

One of the approaches to solving this problem is to employ an arrangement for mounting LEDs having a waveguide path for output of the light that is strongly polarized at a one-side end face on elongate sub-mount members in units of respective RGB colors in such a manner that these submounts are maximally close to one another to thereby achieve color mixture. A great number of such RGB-color submounts are placed together on a substrate, thereby completing a large-area backlight luminous source with uniform illumination capability. Alternatively, an arrangement is employed for setting a submount or a reflective plate capable of allowing an inclined surface(s) at an angle of 45 degrees on one side or on the both sides to act as a reflection plane(s) and for causing the outgoing light, which is given off from the waveguide LEDs to the one-side end face or the both end faces, to rise up toward an upper surface. The intended color mixture is achievable by mounting the RGB LEDs so that adjacent ones are in close proximity to each other per this reflection-surface submount or reflector plate. With the above-noted LED mounting scheme, it is possible to arrange a large-size TV-use LC panel display apparatus having its backlight luminous source with the distance between it and the diffuser plate being set to at most 20 mm or less.

Using the polarizability-enhanced LEDs of the invention, it is possible to largely retain the polarization ratio of the LC panel in the combination with the polarizer plate of LC panel, when compared to ordinary polarizer plates with large polarization ratios. For example, even in cases where a coat-type polarizer plate with a polymer polarization film being formed by coating techniques is employed resulting in the polarization ratio becoming smaller than that of standard polarizer plates, it is possible to achieve the arrangement capable of retaining the polarization ratio of at least 5000:1 or greater in the LC panel, owing to the transmission of the polarized light components of the LEDs through the coat-type polarizer plate. As such coat-type polarizer plate is manufacturable to have a large surface area by using materials and processes low in cost than those of standard polarizer plates, it can be said that this is advantageous for cost reduction of the LC panel.

This invention provides, based on the above-stated arrangements, an improved illumination device using waveguide type LED elements capable of emitting polarized light with increased light use efficiency and also provides by specifically arranging the LED mounting scheme a light source adaptable for use as a large-area backlight module with uniform illumination capability while offering an ability to achieve color mixture enough to obtain the white light. By the illumination device using the LEDs of the invention, it becomes possible to realize a display apparatus using an LC panel low in power consumption and in production costs.

According to the invention, the LEDs for use in the LC panel backlight luminous source are specifically arranged to offer an ability to emit from its light emissive layer the linearly polarized light as strongly polarized in advance, thereby making it possible to improve the light use efficiency with respect to the LC panel. By defining the structures of the light emission layer and waveguide in the LEDs, the light leaving the light emission layer may be taken out in the form of polarized light having its polarization ratio of at least 10 or more and containing those polarized light components with their polarization direction being parallel to the light emission layer and also perpendicular to the light output direction. Thus it becomes possible to utilize for the LC panel backlight the polarized light components maintaining the light output directionality in the waveguide direction only.

Owing to having such polarization ratio-increased polarized light components, it is possible to ensure that the polarization ratio remains at levels of at least two times or more even after transmission through a diffuser film or plate as provided between the LEDs and the LC panel, which in turn makes it possible to permit the light use efficiency to be kept at levels of at least 1.3 times or more, when compared to the case of random light rays. Although in prior art random light-emitting LEDs the light amount is half reduced when passing through the polarizer plate of LC panel, the LEDs of the invention are capable of improving the light use efficiency about twofold, by strengthening the polarization.

It has also been found that even in the case of penetration of the diffusion film or plate to be used to enlarge the illumination range of the backlight in LC panel, the polarization ratio may be kept high although the strongly polarized light components of the LED element of the invention exhibit a weakened polarization ratio than before penetration. In the light emission device of the invention, the polarization ratio was first evaluated through a diffuser film having a thickness of 0.1 to 0.2 mm for use in mobile phone-use LCD panels to reveal the fact that the light use efficiency was improved up to about 1.99 times. In addition, the polarization ratio was evaluated through a diffuser plate with a thickness of about 2 mm for use in large-size LCD TV sets to reveal that the light use efficiency was as large as 1.92 times in case the distance between LEDs and the diffuser plate is 10 mm. Even in case the LED/diffuser distance is 20 mm, it was affirmed that the light use efficiency was improved up to 1.78 times.

Using the LED elements with enhanced polarizability of the invention makes it possible to retain the polarization ratio at greater levels even when using an LC panel as structured using a coat-type polarizer plate. Owing to the transmission through the coat-type polarizer plate of polarized light components of the polarizability-enhanced LED elements of the invention, it is possible to attain the arrangement that offers an increased polarization ratio in LC panel to an extent of at least 5000 to 1 or more. The coated polarizer plate is manufacturable using materials and processes lower than those of ordinary polarizer plates, thereby advantageously enabling the LC panel to decrease in production costs.

As apparent from the foregoing, employing the LED elements of the invention makes it possible to offer an effect that the same light amount is maintainable even if power consumption is reduced relative to the light source of the backlight used for LCD panels. Another advantage lies in an ability to reduce in number the LED elements as required to achieve the same light amount necessary for prior known LC panels. This makes it possible to reduce the load to driver circuitry of the backlight luminous source, which in turn enables the LC panel backlight luminous source to properly operate while using low-power drivers and a less number of LEDs. This is also effective for cost reduction.

Other objects, features and advantages of the invention will become apparent from the following description of the embodiments of the invention taken in conjunction with the accompanying drawings.

DETAILED DESCRIPTION OF THE INVENTION

Currently preferred embodiments of the present invention will now be explained in detail with reference to the accompanying drawings below.

Embodiment 1

Figure 1:
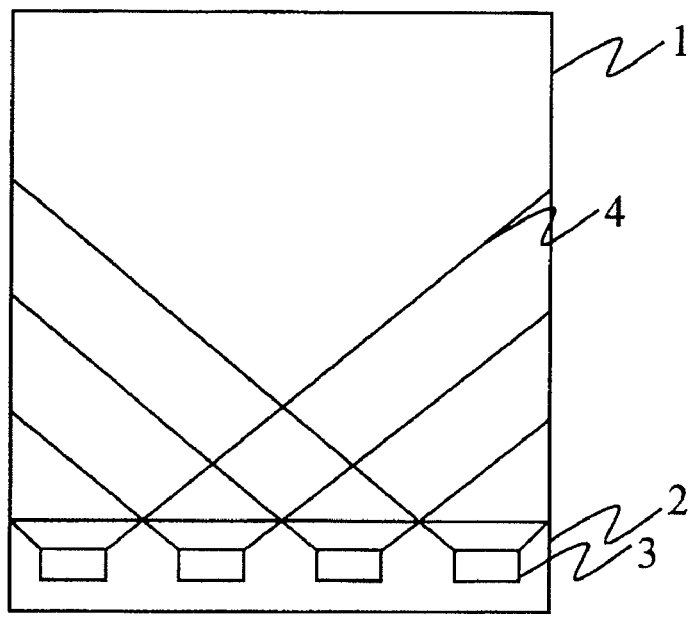
FIG. 1 is a top view of a mobile telephone-use liquid crystal (LC) panel display apparatus using light-emitting diode (LED) elements of the present invention.
Figure 2:
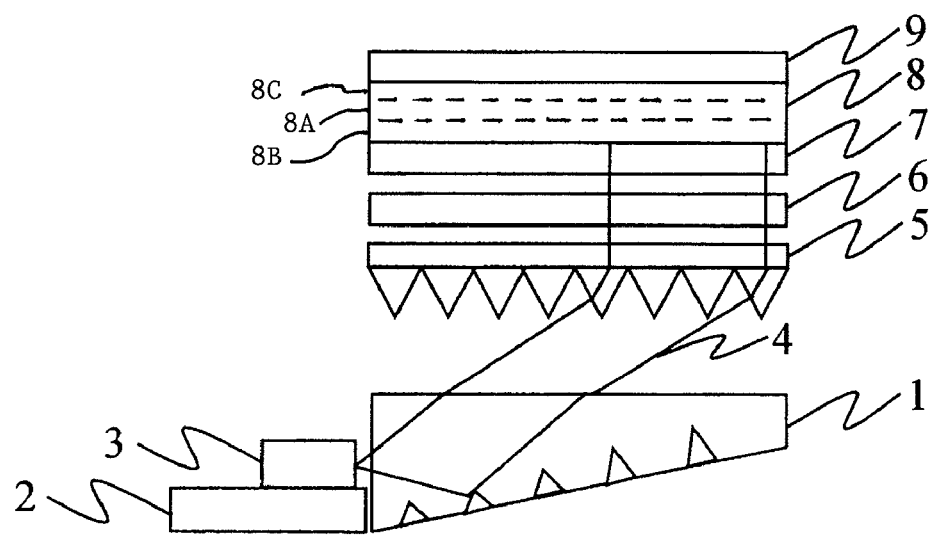
FIG. 2 is a cross-sectional view of the mobile phone-use LC panel display apparatus using the LED elements of this invention.

An embodiment 1 of this invention will be set forth using FIGS. 1 through 9 below. FIG. 1 shows a top view of a display apparatus adaptable for use in mobile cellular phones, which is for explanation of the embodiment 1 of the invention. In addition, FIG. 2 is a cross-sectional view of the mobile phone-use display apparatus shown in FIG. 1. In the top view of FIG. 1 and the sectional view of FIG. 2, there are shown a liquid crystal (LC) panel and a backlight module plus an optical system, which make up the mobile phone-use LC panel display apparatus. The mobile phone-use LC panel display apparatus is arranged to have a plurality of light-emitting diode (LED) elements 3 which are fixed to an adhesive support film 2, with respect to a light guide plate 1. Light rays 4 as given off from respective LED elements 3 behave to enter the LC panel side as shown in FIG. 1, resulting in diffused light illuminating an entirety of the LC panel 8 over the light guide plate 1.

When looking at this illumination behavior in cross-section, as shown in FIG. 2, after the light rays 4 leaving the LED elements 3 fixed on the adhesive support film 2 travel in the light guide plate 1 and exit as diffused light, this light is guided to rise up in an upward direction (in the LC panel direction) through a down-facing or "inverse" prism sheet 5 with a prism pattern formed in the opposite surface to the LC panel 8 and then passes through a diffusion film 6 to become backlight rays. Thereafter, the backlight rays penetrate a polarization plate 7 as provided on the back face side of the LC panel 8 and then pass through the LC panel 8 that is arranged by letting a liquid crystal layer 8A be interposed between a thin film transistor (TFT) substrate 8B and a color filter substrate 8C, as shown in broken line, to reach a polarizer plate 9 on the opposite side, and finally exit outward for observation.

At this time, usually when passing through the polarization plate 7, if the light is randomly diffused light, then only those rays with approximately half of the light intensity can penetrate the polarizer plate 7, resulting in the light use efficiency of backlight becoming almost half-reduced. However, by use of a technique for letting the backlight rays be pre-polarized while designing the light guide plate and optics to permit incidence in the polarized light transmission direction of the polarizer plate 7, it is possible to improve the light use efficiency of the backlight relative to the LC panel 8. The embodiment 1 is arranged to have a structure in which the LEDs 3 for use as the backlight luminous sources are linearly polarized significantly while providing a waveguide structure for guiding such polarized light to exit in a one direction to thereby enable utilization of strongly polarized light capable of being wave-guided in such direction as rays of the backlight. Additionally, an asymmetrical waveguide structure is employed for controlling the reflectivity of an end-face reflection film in such a way as to enable the intensity-increased light to exit from LED end faces only on the side for use as the backlight rays.

Figure 3:
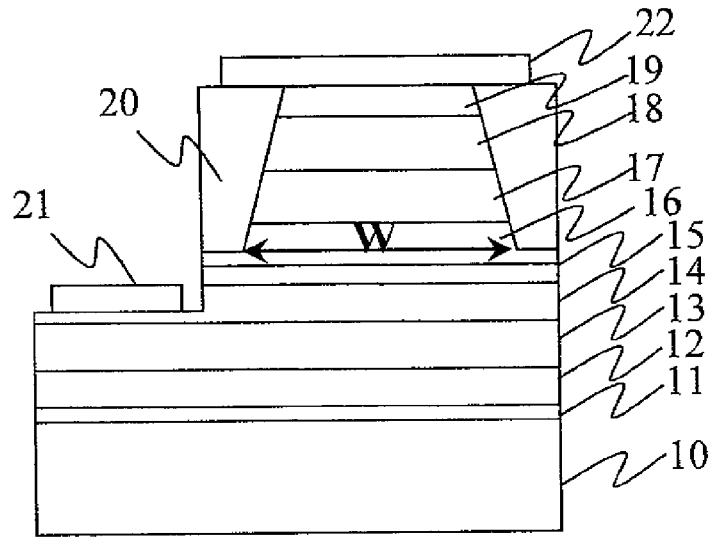
FIG. 3 is a sectional view of an LED element in an embodiment 1 of the invention.
Figure 4:
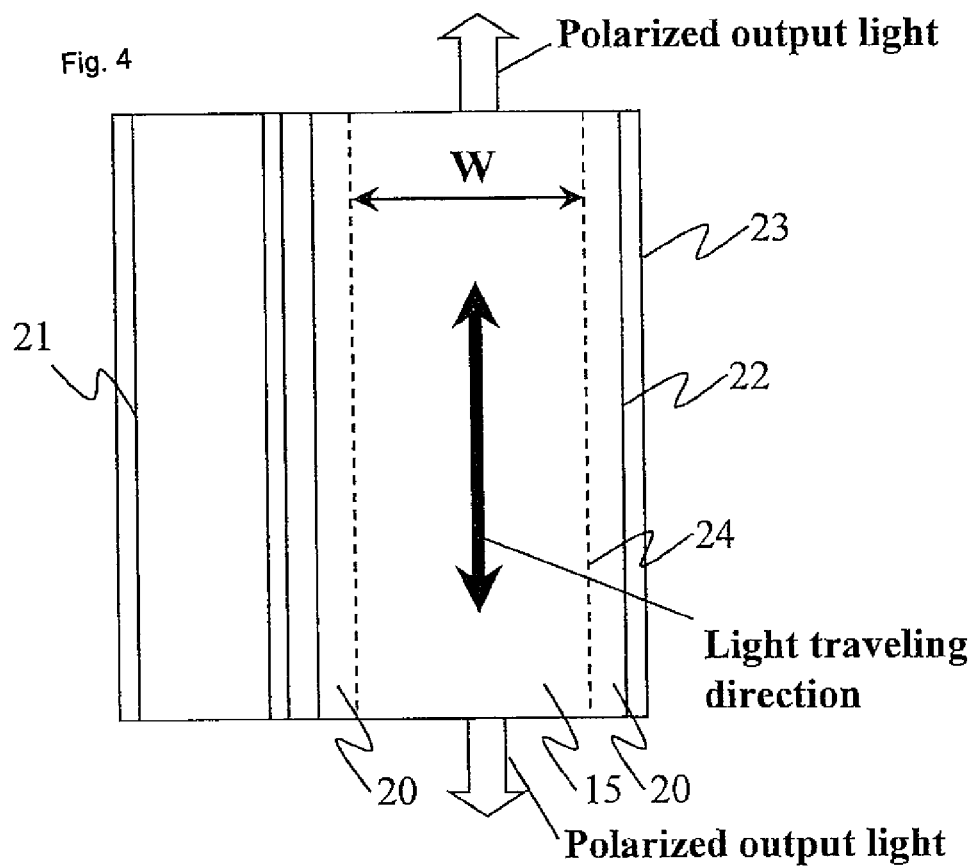
FIG. 4 is a plan view of the LED element in the embodiment 1 of the invention.

FIG. 3 is a cross-sectional diagram for explanation of the structure of an LED element in the embodiment 1 of the invention. FIG. 4 is a top view for explanation of the LED structure in the embodiment 1 of the invention. In FIG. 3 showing the sectional view, first, several layers are sequentially provided through epitaxial growth by organic metal vapor-phase growth techniques on a sapphire single-crystalline substrate or GaN monocrystalline substrate 10, which layers include a GaN buffer layer 11, n-type GaN layer 12, n-type GaN/AlGaN super-lattice light guide layer 13, n-type AlGaN light guide layer 14, compressive distortion-introduced GaInN/GaN multiple quantum well active layer 15, p-type AlGaN light guide layer 16, p-type GaN/AlGaN super-lattice light guide layer 17, p-type GaN layer 18, and p-type GaInN/GaN layer 19.

Thereafter, a waveguide having a waveguide width W is formed by photolithography and etching processes; then, provide on its both sides either a high-resistance GaN layer or a dielectric film 20. Next, photolithography and etching are applied to provide an n-side electrode 21 and a p-side electrode 22 by vapor deposition. Explaining in FIG. 4 showing the top view, the electrodes 21-22 are set in the direction of waveguide path with respect to an entirety of the LED element 23 so that the waveguide width W is set to the same value in the waveguide direction with the waveguide path being linearly provided. After element separation, coating of a low reflective film is applied at an end face on one side while a high reflective film is formed at an end face on the other side. Through these fabrication processes, the LED element 23 is obtained, which is a region with its light emission wavelength ranging from the near-ultraviolet (UV) light to blue light.

In the above-noted structure, the multi-quantum well layer 15 that is a light emissive layer is designed so that indium (In) composition is set largely with biaxial compressive distortion introduced thereinto, whereby the separation between a "heavy" hole band and a "light" hole band becomes larger in the valence band of the GaInN quantum well layer so that strongly TE-polarized light comes to be given off while letting the possibility of transition of low-energy heavy holes and electrons become higher. The direction of this TE-polarized light is such that linear polarization is established in a direction perpendicular to the waveguide direction and yet in parallel with the light emission layer. The polarization ratio of at least 10 or more is readily attainable. The above-noted waveguide structure is arranged so that any appreciable light leakage hardly takes place in directions different from the waveguide direction due to the presence of a buried layer 20 as formed when arranging the waveguide.

With such an arrangement, the polarized light is controlled to propagate only in a one direction along which the waveguide path is formed, thereby providing an approach to effective utilization of such polarized light. Furthermore, by forming the reflective film at the end face while providing the low reflective film on the front face side and providing the high reflective film on the rear face side, it is possible to selectively take out the polarized light with increased intensity toward the front face side. Upon formation of the waveguide, the setting was done for permitting the waveguide width W to be as large as possible, in order to maximize the light emission width to thereby spread the backlight rays.

Figure 5:
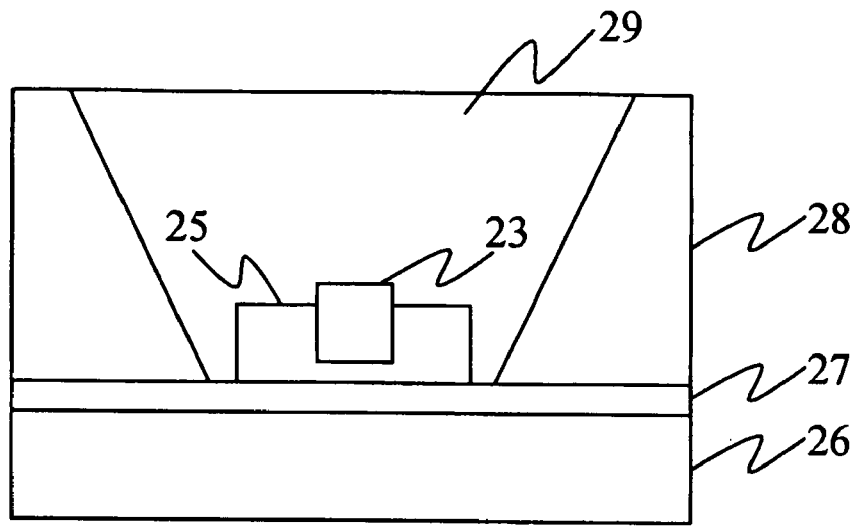
FIG. 5 is a sectional view of a mounting device for mounting of the LED element in the embodiment 1 of the invention.

FIG. 5 is a sectional diagram of a mounting device for mounting and supporting thereon more than one LED element in this invention. When mounting an LED element 23, as shown in FIG. 5, first, let it be fixed on a sub-mount body 25 by either die-wire bonding or flip-chip mount techniques, followed by mounting the sub-mount 25 on a thin dielectric sheet 27 as provided on a metallic substrate 26, for example. In the case of the flip-chip mounting, the intended mounting is done by use of either an anisotropic conductive film or anisotropic conductive paste while retaining electrical conductivity between lead wires and LEDs. Similar results are also obtainable by replacing the submount with a lead frame. Thereafter, a reflection plate 28 is provided, followed by molding of a resin 29, which contains therein a yellow-color fluorescent material. The metal substrate 26 may be replaced by a ceramics substrate or glass-epoxy substrate. An adhesive is usable in place of the dielectric sheet 27. The same goes with embodiments to be described later.

In the device structure, the use of the LED element 23 with its light emission wavelength set to that of blue color and the yellow fluorescent material permits occurrence of color mixture, thereby providing a backlight luminous source of the white color. Another approach is that green and red-color fluorescent materials are introduced into the fluorescent material-containing region 29 for use in combination with the LED element 23 having blue-color light emission wavelength, thereby to provide a backlight luminous source with white color, which is a mixture of these colors. Still another approach is to using in combination an LED 23 with its light emission wavelength of the near UV light and fluorescent materials of blue and green plus red as introduced into the fluorescent material-containing resin 29, thereby to provide a backlight luminous source of the color-blended white color.

As shown in FIG. 5, the structure with the LED 23 mounted thereon is placed at a prespecified position shown in FIGS. 1 and 2 for use as the light source of the backlight module. In this event, in order for this backlight source to form light rays which are spreadable to cover a maximally widened range of space, it is desirable and advantageous that output light as given off from the LED behaves to spread at angles as wide as possible. To this end, the waveguide structure is uniquely arranged to enlarge the spread angle of the outgoing light.

Figure 6:
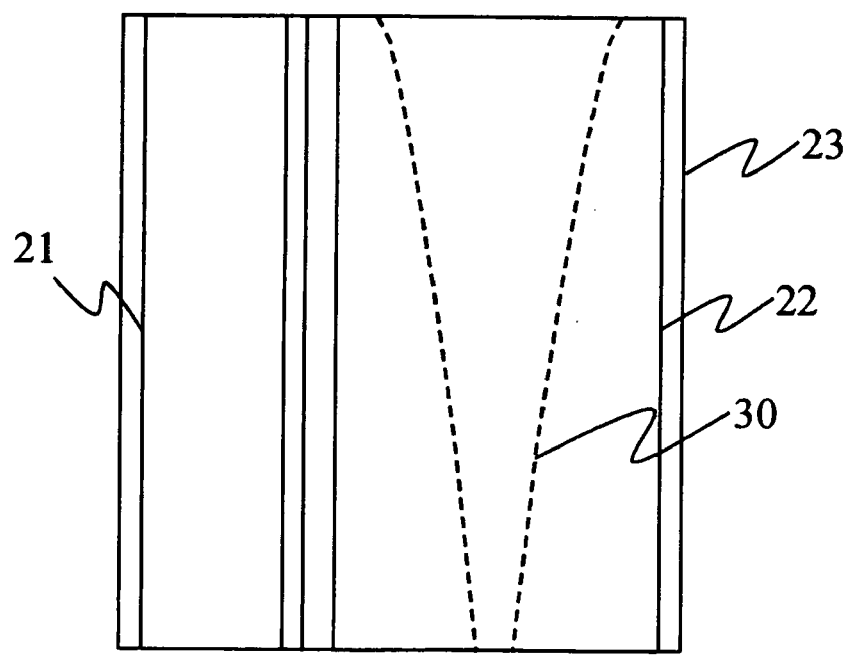
FIG. 6 is a top view of a modified example of the LED element in the embodiment 1 of the invention.

FIG. 6 is a top view of a modified example of the LED element in the invention. As shown in FIG. 6, a curved waveguide path 30 is arranged in such a way as to set the waveguide width W to be as wide as possible at a front end face whereat the outgoing light is released while letting the waveguide width W be maximally narrowed at a rear end face that serves as a reflection plane, whereby it was possible to permit the spread angle of the outgoing light being emitted from the front end face to be larger than that of the linear waveguide of FIG. 4.

Figure 7:
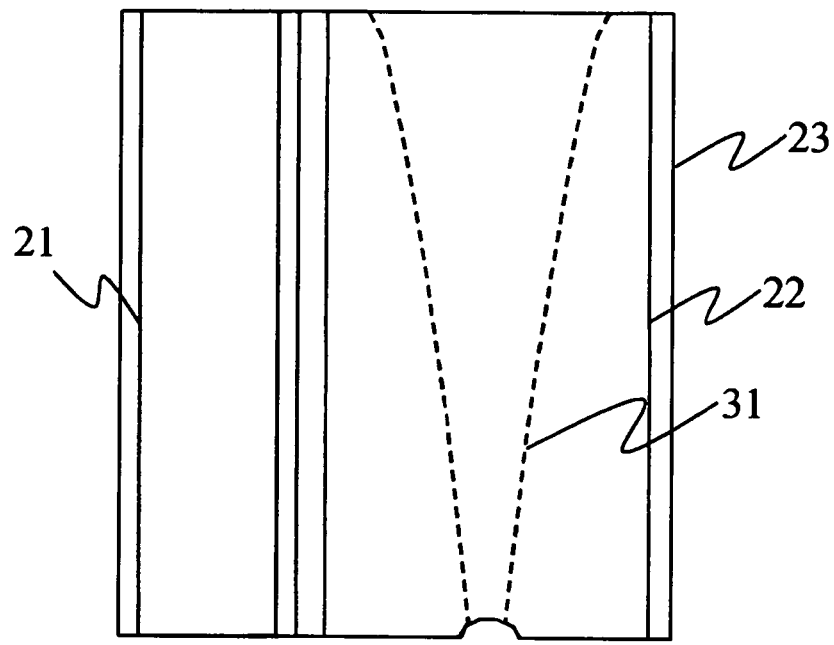
FIG. 7 is a top view of another modification of the LED element in the embodiment 1 of the invention.
Figure 8:
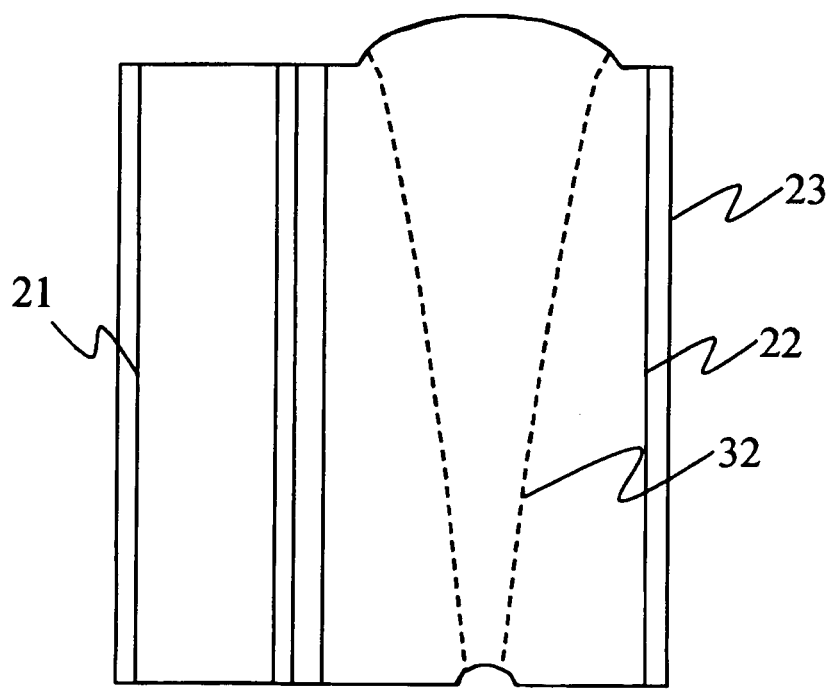
FIG. 8 is a top view of a further modification of the LED element in the embodiment 1 of the invention.

FIG. 7 is a top view of another modification of the LED element in the invention. FIG. 7 shows a curve-shaped waveguide. FIG. 8 is a top view of another further modification of the LED element in the invention. While a curve-shaped waveguide 31 with its rear end face for use as the reflection plane being designed to have a concave-like curved surface is shown in FIG. 7, it is also possible to use a curved waveguide 32 which is designed so that its front end face has a convex-like curved surface whereas the rear end face has a concave-like curved surface as shown in FIG. 8. In the curved waveguide structures with the end faces having concavo-convex curved surfaces, it was possible to enlarge the spread angle of the outgoing light as given off from the front end face to an extent larger than that in the case of the curved waveguide in FIG. 6.

With these arrangements, it is possible even for LEDs of the waveguide type to largely set the spread angle, which in turn makes it possible to ensure the polarized light to output in a single direction, thereby enabling effective utilization thereof. Regarding a one LED with strong polarizability, evaluation was done in a way such that the polarization ratio is measured through a diffuser film with a thickness of 0.1 to 0.2 mm for use in mobile phone LC panels. Results of the evaluation revealed that the polarization ratio increases by a factor of about 480 and the light use efficiency is improved up to 1.99 times, although the polarization ratio is weaker than that prior to penetration.

Figure 9:
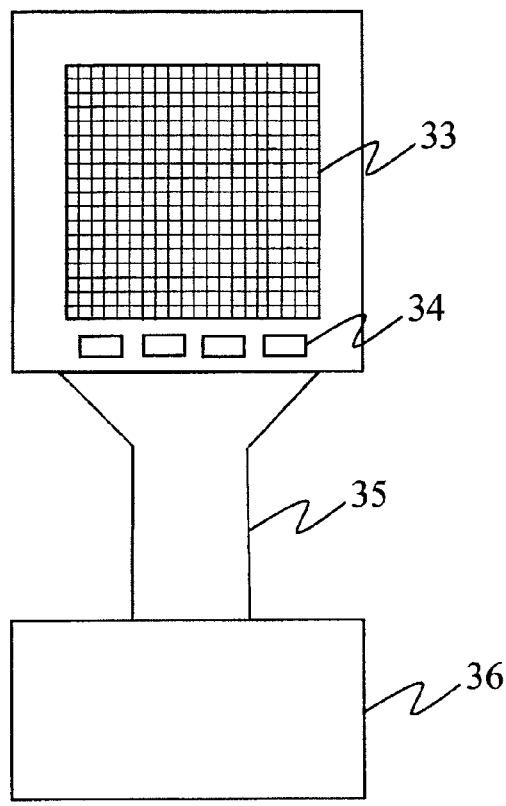
FIG. 9 is a plan view of a mobile phone-use LC panel display apparatus using LED elements for explanation of the embodiment 1 of the invention.

FIG. 9 is a plan view of a mobile phone-use LC panel display apparatus using the LED element embodying this invention. As shown in FIG. 9, LED elements 34 of the waveguide type, which are strong in polarizability in accordance with the embodiment 1 of the invention, are laid out and then rendered operative, for use as the backlight for an LC panel 33 having an LC layer sandwiched between a TFT substrate and a color filter substrate, followed by evaluation. As a result, it was affirmed that an operating current and operation voltage required for achievement of the same light amount and the same brightness or luminance on such panel are lower than those of prior art area light emission type LEDs for emitting random light rays, which leads to achievement of low power consumption. Note here that using the LEDs by pulse-drive schemes makes it possible to further reduce the power consumption.

Using the polarization-enhanced LEDs of the embodiment 1 makes it possible to maintain the polarization ratio largely even when combined with an LCD panel arranged using a coat-type polarization plate(s). By using the backlight arranged by the LEDs of the embodiment 1 and coat-type polarizer plate(s), it becomes possible to provide a structure capable of retaining polarization ratios of 5000 to 1 or greater in the LCD panel. The use of the backlight of the embodiment 1 offers advantages which follow: even an LCD panel using the coat-type polarizer plate(s) maintain the polarization ratio required; and, such LCD panel is manufacturable at low costs.

Additionally the LEDs and the optics such as the light guide plate are applicable not only to LCD panels used for the mobile phones but also to the backlight source and optics of personal computer-use LCD panels.

Embodiment 2

Figure 10:
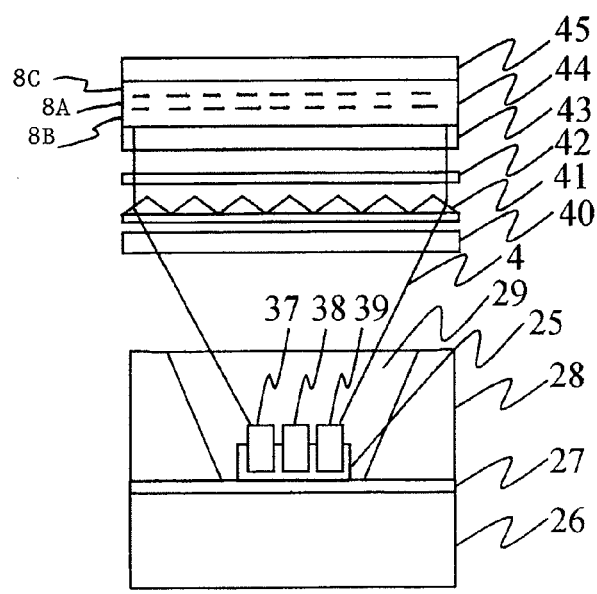
FIG. 10 is a sectional view of a television-use LC panel display apparatus using LED elements for explanation of an embodiment 2 of the invention.
Figure 11:
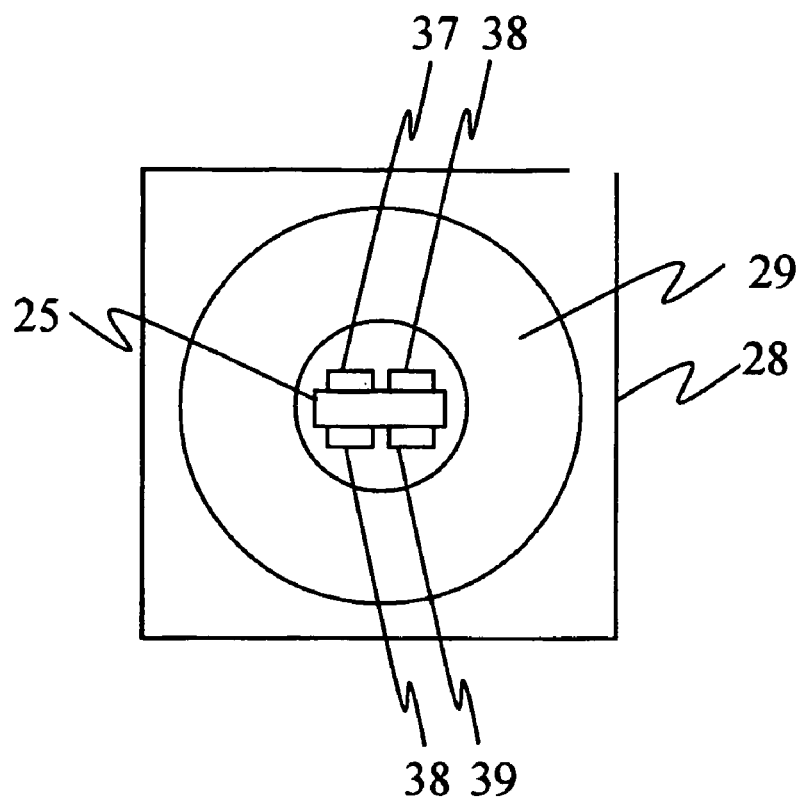
FIG. 11 is a plan view of a mounting device for mounting LED elements in the embodiment 2 of the invention.
Figure 12:
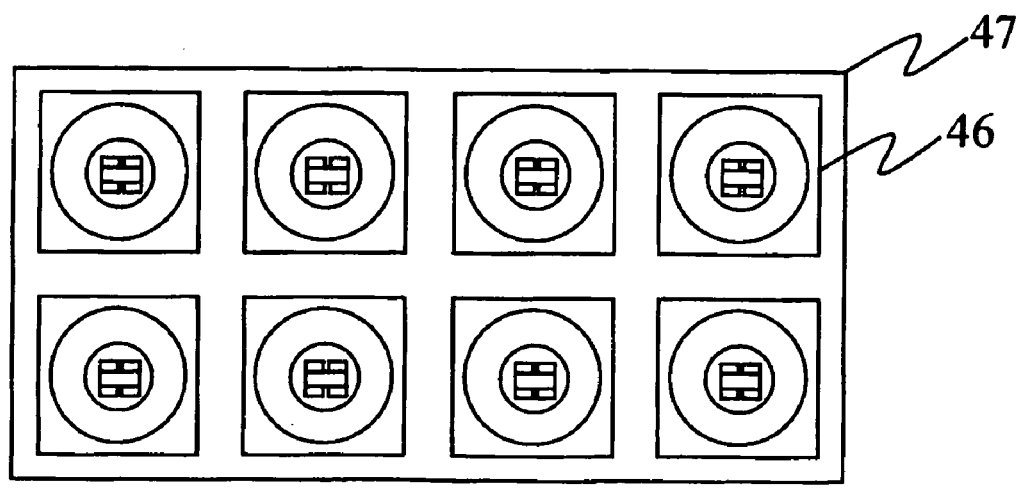
FIG. 12 is a sectional view of a unit device for mounting the LED elements in the embodiment 2 of the invention.
Figure 13:
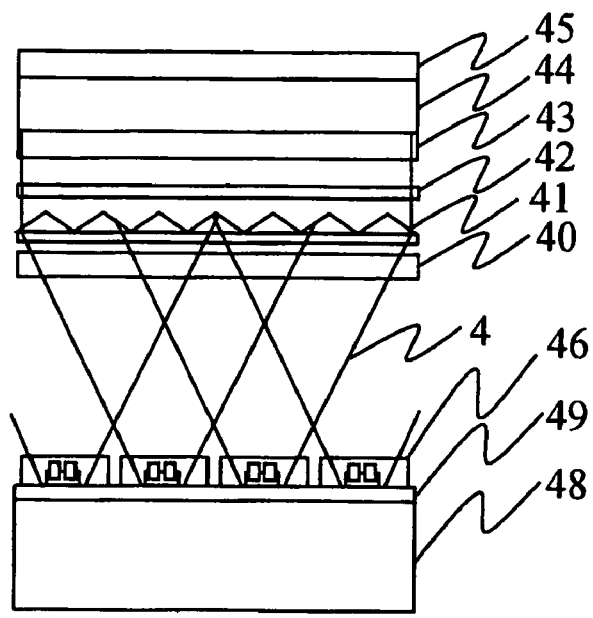
FIG. 13 is a sectional view of a TV-use LC panel display apparatus with a layout of mount devices in the embodiment 2 of the invention.
Figure 14:
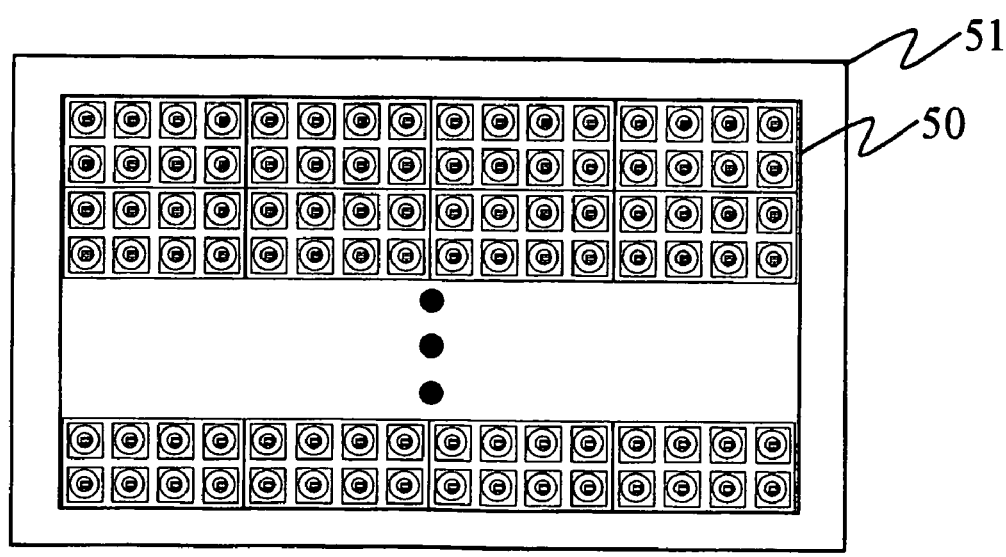
FIG. 14 is a top view of the TV-use LC panel display apparatus with a layout of the mount devices in the embodiment 2 of the invention.

An embodiment 2 of this invention will next be explained with reference to FIGS. 10 to 14. FIG. 10 is a cross-sectional view of a television (TV)-use liquid crystal (LC) panel display apparatus using the light-emitting diode (LED) elements of the invention. FIG. 11 is a top view of a mounting device for mounting thereon LED elements in the embodiment 2. FIG. 12 is a sectional view of a unit device for mounting the LEDs of the embodiment 2. FIG. 13 is a sectional view of the TV-use LC panel display apparatus with a layout of mount devices of the embodiment 2. FIG. 14 is a top view of the TV-use LC panel display apparatus with the layout of mount devices of the embodiment 2.

The TV-use LCD panel and backlight module plus optics will be explained by using FIG. 10 that shows its sectional view, for example. As shown in FIG. 10, the LED-based backlight associated with the TV-use LCD panel is arranged so that a set of respective LED elements 37, 38 and 39 of three primary colors—i.e., red, green and blue—are stably placed on a sub-mount member 25, which resides on a dielectric sheet 27 that is on a metal substrate 26 for example, while setting a reflection plate 28 with a resin 28 molded.

By mounting the red (R), green (G) and blue (B) three-color light sources 37-39 so that neighboring ones are adjacent to each other, light rays emitted therefrom become white light by color mixture. As shown in FIG. 10, the color-mixed white backlight rays of the mounted LEDs 37-39 first pass through the space and are guided to travel through a diffuser plate 40 in order for these rays to have uniform spread thereafter and then rise up in the upward direction (on the LC panel 44 side) through an up-facing or "positive" prism sheet 41 having a prism surface on the LC panel 44 side and further penetrate a thin diffuser film 42. Thereafter, the backlight rays pass through a polarizer plate 43 of the TV-use LCD panel and then penetrate TV-use TFTs and the TV-use LCD panel 44, which includes a liquid crystal layer 44A disposed therebetween a pair of substrates 44B and 44C, as shown in broken line, to reach a polarizer plate 45 on the opposite side, and next exit as outgoing light to be observed.

At this time, usually when passing through the polarizer plate 43, if the light is randomly diffused light, then only those rays with nearly half of the light intensity can penetrate the polarizer plate 43, resulting in the light use efficiency of backlight becoming almost half-reduced. However, by use of a technique for letting the backlight rays be pre-polarized while designing the light guide plate and optics to permit incidence in the polarized light transmission direction of the polarizer plate 43, it is possible to improve the light use efficiency of the backlight relative to the LC panel. The embodiment 2 is arranged to have a structure in which the LEDs 37-39 for use as the backlight luminous sources are linearly polarized significantly while providing a waveguide structure for guiding such polarized light to exit in a one direction to thereby enable utilization of strongly polarized light capable of being wave-guided in such direction as rays of the backlight. Additionally, an asymmetrical waveguide structure is employed for controlling the reflectivity of an end-face reflection film in such a way as to enable the intensity-increased light to exit from LED end faces only on the side for use as the backlight rays.

Detailed arrangements of the LEDs 37-39 in the embodiment 2 will be explained below. In regard to the LEDs with light emission wavelengths equivalent to those of blue and green light rays, these are manufacturable by using similar materials in a similar way to that in the embodiment 1 as stated previously. More specifically, as in the device structure shown in FIG. 3, first, several layers are sequentially provided through epitaxial growth by organic metal vapor-phase growth techniques on a sapphire single-crystalline substrate or GaN monocrystalline substrate 10, which layers include a GaN buffer layer 11, n-type GaN layer 12, n-type GaN/AlGaN super-lattice light guide layer 13, n-type AlGaN light guide layer 14, compressive distortion-introduced GaInN/GaN multiple quantum well active layer 15, p-type AlGaN light guide layer 16, p-type GaN/AlGaN superlattice light guide layer 17, p-type GaN layer 18, and p-type GaInN/GaN layer 19. Thereafter, a waveguide having a waveguide width W is formed by photolithography and etching processes, followed by providing on its both sides either a high-resistance GaN layer or a dielectric film 20.

Next, photolithography and etching are applied to provide an n-side electrode 21 and a p-side electrode 22 by vapor deposition. In a similar way to that shown in FIG. 4, the LEDs are manufacturable so that the waveguide width W is set to the same value along the waveguide direction with a waveguide path being provided linearly. After element separation, coating of a low reflective film is applied at an end face on one side while a high reflective film is formed at an end face on the other side. Additionally, through similar processes, it is possible to obtain an LED element having a curved waveguide path, such as shown in any one of FIGS. 6-8.

When providing the light emission layer, adjust formation conditions of the light emission layer having the compressive distortion-introduced GaInN/GaN multi-quantum well active layer—mainly, the In composition and GaInN quantum well width of the GaInN quantum well layer—whereby the light emission wavelength is selectable in a range spanning from the blue to green colors. In this way, the blue and green LEDs were formed.

Next, an LED with red light emission wavelength is manufacturable using the AlGaInP material in a similar way to that of the embodiment stated supra. Similarly, first formed sequentially on an n-type GaAs single-crystal substrate are an n-type GaAs buffer layer, n-type AlGaInP light guide layer, compressive distortion-introduced AlGaInP/AlGaInP multi-quantum well active layer, p-type AlGaInP light guide layer, p-type GaInP layer and p-type GaAs layer. These layers are formed by epitaxial growth using organic metal vapor phase growth methods. Thereafter, photolithography and etching are used to form a waveguide path having the waveguide width W, followed by fabrication of a high-resistance AlInP layer or a dielectric film on the both side thereof.

Next, photolithography and etching are applied to provide an n-side electrode and p-side electrode by vapor deposition. In a similar way to that shown in FIG. 4, the LEDs are manufacturable so that the waveguide width W is set to the same value along the waveguide direction with a waveguide path being provided linearly. After element separation, coating of a low reflective film is applied at an end face on one side while a high reflective film is formed at an end face on the other side. Additionally, through similar processes, it is possible to obtain an LED element having a curved waveguide path, such as shown in FIGS. 6-8. When providing the light emission layer, adjust formation conditions of the light emission layer having the compressive distortion-introduced GaInN/GaN multi-quantum well active layer—mainly, the In composition and GaInN quantum well width of the GaInN quantum well layer—whereby the light emission wavelength is selectable in a range spanning from the orange to red colors. In this way, the red LED was formed.

Additionally, by lessening the light guide loss separately, it is possible to arrange the LED of large light output. More specifically, in view of the fact that the GaAs single-crystal substrate used for the substrate experiences occurrence of light absorption since the forbidden band width energy width becomes less relative to the above-noted light emission wavelength, it was replaced by a transparent substrate with respect to the light emission wavelength. This is similar to the one stated above in that several layers are sequentially formed on the n-type GaAs monocrystal substrate by epitaxial growth using organic metal vapor phase growth methods, which layers include an n-type GaAs buffer layer, n-type GaInP layer, n-type AlGaInP light guide layer, compressive distortion-introduced AlGaInP/AlGaInP multi-quantum well active layer, p-type GaInP layer, p-type AlGaInP light guide layer, and p-type GaInP layer. Thereafter, let a p-type GaInP layer or the like be adhered to a surface of the substrate that is transparent relative to the light emission wavelength, including but not limited to a glass substrate, sapphire substrate, ceramic substrate, semiconductor substrate made of GaP or GaN or else.

Next, selectively remove by etching the n-type GaAs substrate and n-type GaAs buffer layer. Furthermore, photolithography and etching are used to form a waveguide having the waveguide width W, followed by formation of a high-resistance AlInP layer or dielectric layer on the both sides thereof. Next, photolithography and etching are applied to provide an n-side electrode and p-side electrode by vapor deposition. In a similar way to that shown in FIG. 4, the LEDs are manufacturable so that the waveguide width W is set to the same value along the waveguide direction with a waveguide path being provided linearly. After element separation, coating of a low reflective film is applied at an end face on one side while a high reflective film is formed at an end face on the other side. Additionally, through similar processes, it is possible to obtain an LED element having a curved waveguide path, such as shown in FIGS. 6-8. When providing the light emission layer, adjust formation conditions of the light emission layer having the compressive distortion-introduced GaInN/GaN multi-quantum well active layer—mainly, the In composition and GaInN quantum well width of the GaInN quantum well layer—whereby the light emission wavelength is selectable in a range spanning from the orange to red colors. In this way, the red LED was formed.

In the above structure, the multi-quantum well layer which is a light emissive layer is designed so that the In composition is set largely with biaxial compressive distortion introduced thereinto, whereby the separation between a heavy hole band and a light hole band becomes larger in the valence band of the GaInN quantum well layer or AlGaInP quantum well layer so that strongly TE-polarized light comes to be given off while letting the possibility of transition of low-energy heavy holes and electrons become higher. The direction of this TE-polarized light is such that linear polarization is established in a direction perpendicular to the waveguide direction and yet in parallel with the light emission layer. The polarization ratio of at least 10 or more is readily attainable. The above-noted waveguide structure is arranged so that any appreciable light leakage hardly takes place in directions different from the waveguide direction due to the presence of a buried layer as formed when arranging the waveguide.

With this arrangement, the polarized light is controlled to propagate only in a one direction along which the waveguide path is formed, thereby defining the direction for utilization of such polarized light. Furthermore, by forming the reflective film at the end face while providing the low reflective film on the front face side and providing the high reflective film on the rear face side, it is possible to selectively take out the polarized light with increased intensity toward the front face side. Upon formation of the waveguide, the setting was done for permitting the waveguide width W to be as large as possible, in order to maximize the light emission width to thereby spread the backlight rays.

When mounting the RGB three-color LED elements, as shown in FIG. 10, first, let it be fixed on a sub-mount body 25 by either die-wire bonding or flip-chip mount techniques, followed by mounting the sub-mount 25 on a thin dielectric sheet 27 as provided on a metallic substrate 26, for example. In the case of the flip-chip mounting, the intended mounting is done by use of either an anisotropic conductive film or anisotropic conductive paste while retaining electrical conductivity between lead wires and LEDs. Similar results are also obtainable by replacing the submount with a lead frame. Thereafter, a reflection plate 28 is provided, followed by molding of a resin 29, which contains therein dispersion particles for the RGB three-color LEDs. With the above-noted procedure, a white color backlight luminous source is completed, with output light rays of the RGB LEDs being mixed together.

In order for this backlight source to form light rays which are spreadable to cover a maximally widened range of space, it is desirable and advantageous that output light as given off from the LED behaves to spread at angles as wide as possible. To this end, the waveguide structure is uniquely arranged to enlarge the spread angle of the outgoing light. As shown in FIG. 6, a curved waveguide path is arranged so that the waveguide width W is set to be as wide as possible at the front end face from which outgoing light is given off while the waveguide width W is set to be as narrow as possible at the rear end face that serves as a reflection plane, whereby it was possible to allow the spread angle of the outgoing light as given off from the front end face to be greater than that of linear waveguides. The curved waveguide may be arranged as the curved waveguide with the reflection plane-functioning rear end face being designed to have a concave-like surface as shown in FIG. 7 or, alternatively, the curved waveguide with the front end face having a convex-like curved surface and the rear end face having a concave-like surface as shown in FIG. 8.

In the curved waveguide structures of FIGS. 7-8 with their end faces having concavo-convex curved surfaces, it was possible to enlarge the spread angle of the outgoing light given off from the front end face to an extent greater than that in the case of curved waveguide in FIG. 6. With these features, it was possible for the waveguide-type LEDs to largely set the spread angle, which makes it possible to permit the polarized light to output in a single direction, thereby enabling effective utilization thereof. Regarding a one LED with strong polarizability, evaluation was done in a way such that the polarized light ratio is measured through a diffuser plate having a thickness of 2 mm for use in TV LCD panels. Results of the evaluation revealed that in the case of a distance between the LED and the diffuser plate is 10 mm, the polarization ratio increases by a factor of about 23 and the light use efficiency is 1.92 times greater, although the polarization ratio is weaker than that prior to penetration. Even in the case of the LED/diffuser distance is 20 mm, it was affirmed that the polarization ratio becomes greater by a factor of about 8 and the light use efficiency is improved up to 1.78 times.

For these LEDs, in order to further increase the illuminance at a green element, two identical green-color LEDs are used and mounted together. In FIG. 11 showing the top view, one red-color LED 37, two green LEDs 38 and one red LED 39 are mounted together on the sub-mount member 25, which is disposed at an opening portion of a reflector plate 28 of the device in an arrangement equivalent to that of FIG. 10. Thereafter, a resin 29 with diffusion particles scattered therein is molded to thereby cause the three-color LEDs to constitute a single unit for use as a white light source.

Next, as shown in FIG. 12, a prespecified number of white-light luminous source units 46 are settled on a unit substrate 47 to thereby complete a white light source module. For example, in this case, eight white light source units 46 are disposed to provide the white light source module. A structure with this white light source module used as a backlight in a similar way to that of FIG. 10 is shown in FIG. 13. Shown herein is the cross-sectional structure of an example having one white light source module 46 as mounted to overlie a unit-use metal substrate 48 and its dielectric sheet 49 with electrical wires railed thereon. Other optical arrangements are identically the same as those of FIG. 10.

As shown in FIG. 14, the plurality of white light source units 46 are laid out in a matrix of rows and columns on unit substrates 47 in a manner adaptable for use as a backlight in each size of TV-use LCD panel. In this case, a backlight luminous source plate 50 on which the unit substrates 47 with the multiple white light source units 46 are densely disposed thereon is capable of achieving uniform illumination over a large area of the TV-use LCD panel through a diffuser plate. By changing the number and layout of the unit substrates 47, it is possible to attain usability as the backlight luminous source in various sizes of LCD panels for TV sets.

In this embodiment, the waveguide-type LED elements capable of wave-guiding polarized light with strong polarizability are used to achieve the light source capable of setting large spread angles and emitting the polarized light in a single direction to thereby enable effective utilization while at the same time arranging the white light source due to the color mixture of three RGB colors to thereby make it possible to allow the polarization ratio and light use efficiency to stay high even through the diffuser plate of TV-use LCD panel.

Owing to this feature, it is possible to provide a large-area/uniform backlight for use in TV-use LCD panels. Another advantage is that the operating current and operation voltage can be lowered to thereby reduce power consumption in order to attain the same light amount and the same luminance on the panel when compared to the case of mounting of prior known area emission type LEDs for emitting random light rays. Additionally this light emission device is high in light use efficiency when compared to the case of mounting the prior art area emission type LEDs for emitting random light rays, so it is also possible to reduce in number the LED elements used, thereby lowering production costs. Regarding the polarizer plates of LCD panel also, similar results are obtainable by employing an approach to using polarizer plates less in polarization ratio or using polarizer plates of low costs. This is advantageous for cost reduction.

It is also possible to further lower the power consumption by using a scheme for driving RGB three-color LED elements by pulse currents simultaneously or independently of one another. In addition, by performing a color displaying operation while combining a color filter(s) as used in the LCD panel and the operations of RGB three-color LEDs, it is possible to expand its color reproduction range and also further improve monochrome displayability. The light emission device and optical system of this embodiment are applicable to backlight sources and optics of LCD panels for use in small-size to large-size TV receivers.

Embodiment 3

Figure 15:
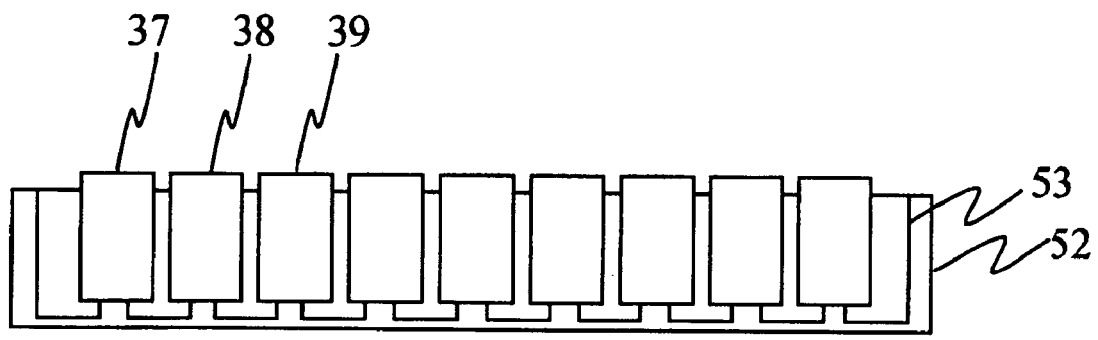
FIG. 15 is a side view of a structure for mounting, on a sub-mount, LED elements in an embodiment 3 of the invention.
Figure 16:
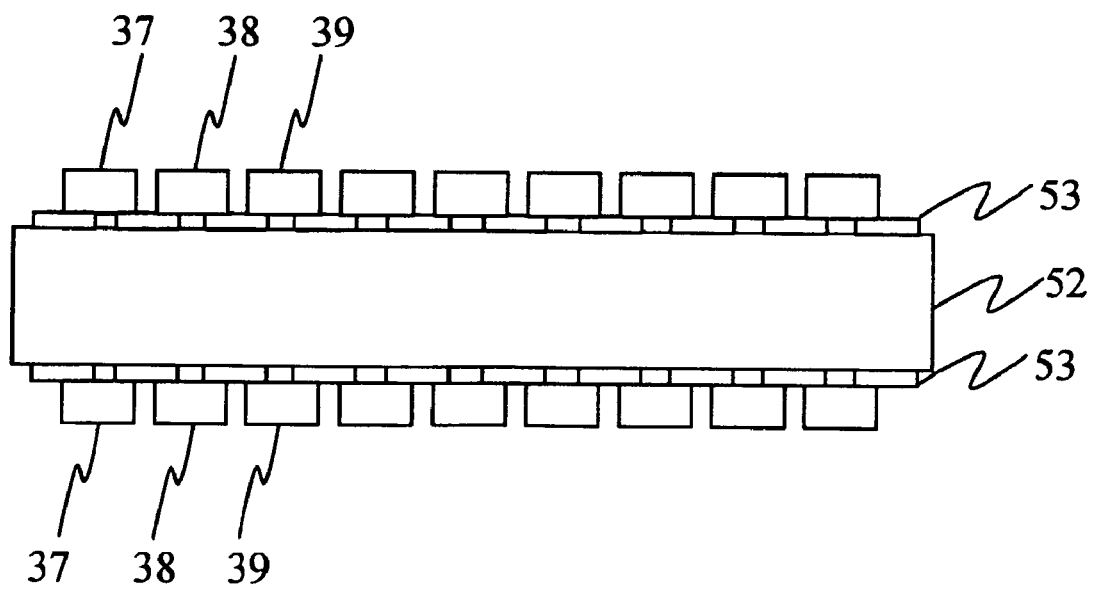
FIG. 16 is a top view of the structure for mounting on the sub-mount the LED elements in the embodiment 3 of the invention.
Figure 17:
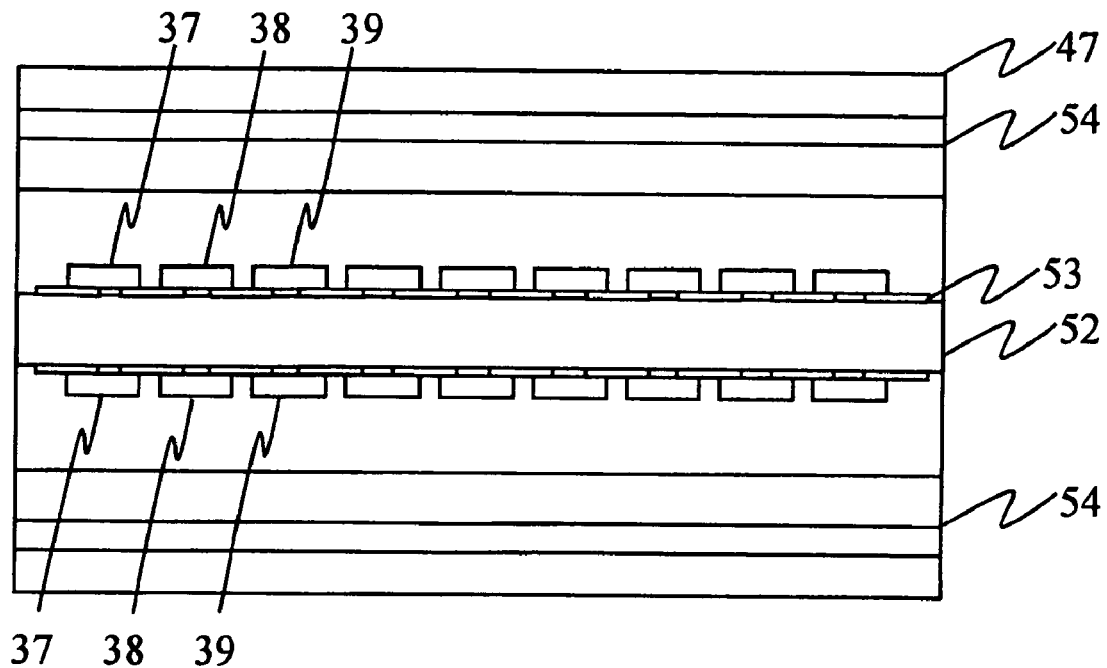
FIG. 17 is a top view of a unit device for mounting the LED elements in the embodiment 3 of the invention.
Figure 18:
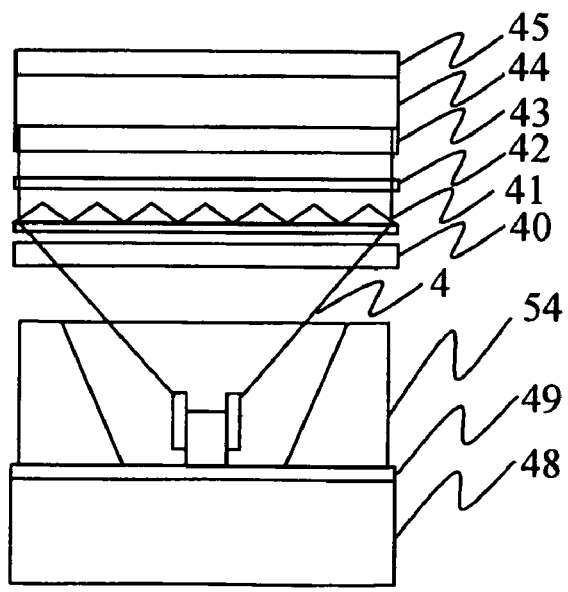
FIG. 18 is a sectional view of a TV-use LC panel display apparatus with a layout of the mounting unit devices in the embodiment 3 of the invention.
Figure 19:
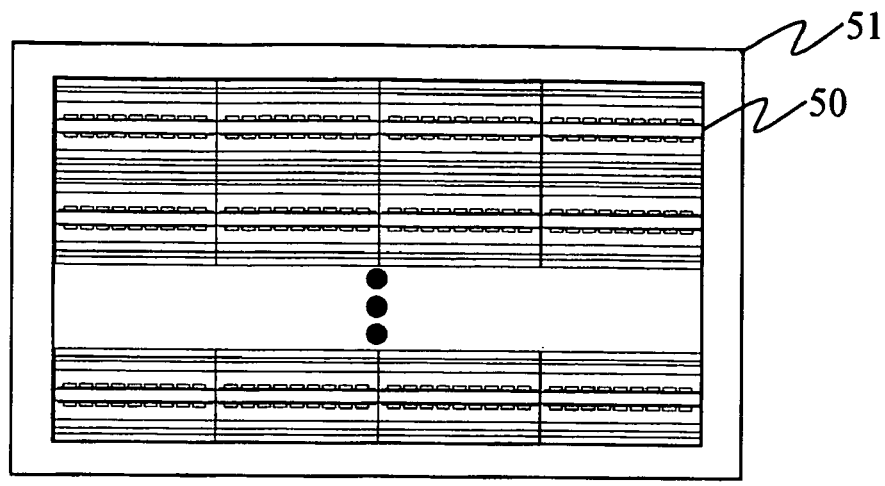
FIG. 19 is a top view of the TV-use LC panel display apparatus with the layout of the mounting unit devices in the embodiment 3 of the invention.

An embodiment 3 of the invention will be set forth using FIGS. 15 to 19 below. FIG. 15 is a side view of a structure for mounting, on a sub-mount member, LED elements of the embodiment 3. FIG. 16 is a top view of the structure for mounting on the sub-mount the LEDs of the embodiment 3. FIG. 17 is a top view of a unit device for mounting thereon the LEDs of the embodiment 3. FIG. 18 is a cross-sectional view of a TV-use LC panel display apparatus with a layout of mounting unit devices of the embodiment 3. FIG. 19 is a top view of the TV-use LC panel display apparatus with the mounting unit device layout of the embodiment 3.

While the embodiment 3 also is arranged to manufacture and mount RGB three-color LED elements in a similar way to that of the embodiment 2, these LEDs are disposed and mounted as shown in FIGS. 15-16. In FIG. 15 showing a sectional view, RGB three-color LED elements 37, 38, 39 are linearly laid out and mounted on a sub-mount member 52 with a pattern of metal wires 53 formed thereon. In the case of flip-chip mounting scheme, such mounting may be done while using an anisotropic conductive film or paste to provide electrical conductivity between the wires and LEDs. Optionally, in this event, the submount may alternatively be a lead frame or still alternatively be made of a metal, semiconductor or ceramics.

In FIG. 16 showing a top view, similar RGB three-color LEDs are linearly disposed and mounted on the other surface of the submount 52, which is on the opposite side to the submount surface shown in FIG. 15. Next, as shown in FIG. 17, this LED-disposed/mounted submount is settled on a unit substrate 47. Also mounted is a reflector plate 54 having a corresponding length, thereby to provide a white light source for use as the backlight.

This white light source unit is shown as the backlight in FIG. 18. Shown herein is an exemplary cross-sectional view in a case where the white light unit substrate 47 is mounted on a base which is made up of a unit-use metal substrate 48 and its overlying dielectric sheet 49 with electrical wiring leads railed thereon. The other optical arrangements are identically the same as those of FIG. 10 or FIG. 13. As shown in FIG. 19, RGB three-color LEDs-mounted unit substrates 47 are laid out in rows and columns in a manner adaptable for use as a backlight in each size of TV-use LCD panel. In this case, a backlight luminous source plate 50 on which the RGB three-color LED unit substrates 47 are densely disposed thereon is capable of achieving uniform illumination over a large area of TV-use LCD panel 51 through a diffuser plate. By changing the number and layout of the unit substrates 47, it is possible to attain usability as the backlight luminous source in various sizes of TV-use LCD panels. The embodiment 3 also offers, as the backlight for use in TV-use LCD panels, similar effects and advantages to those of the embodiment 2 stated supra.

Embodiment 4

Figure 20:
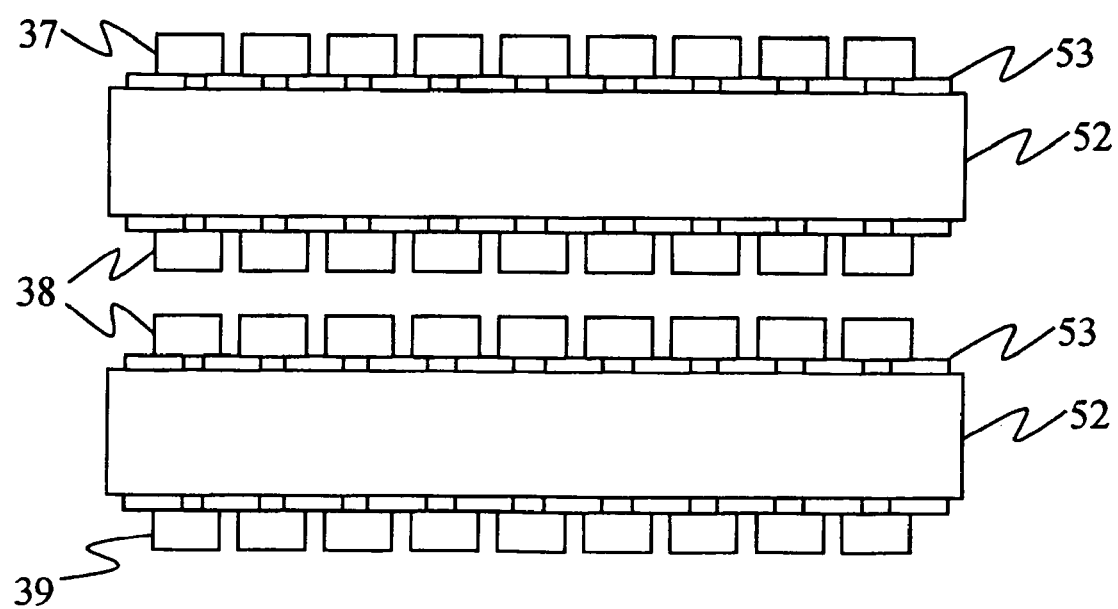
FIG. 20 is a top view of a structure for mounting, on a sub-mount, LED elements in an embodiment 4 of the invention.
Figure 21:
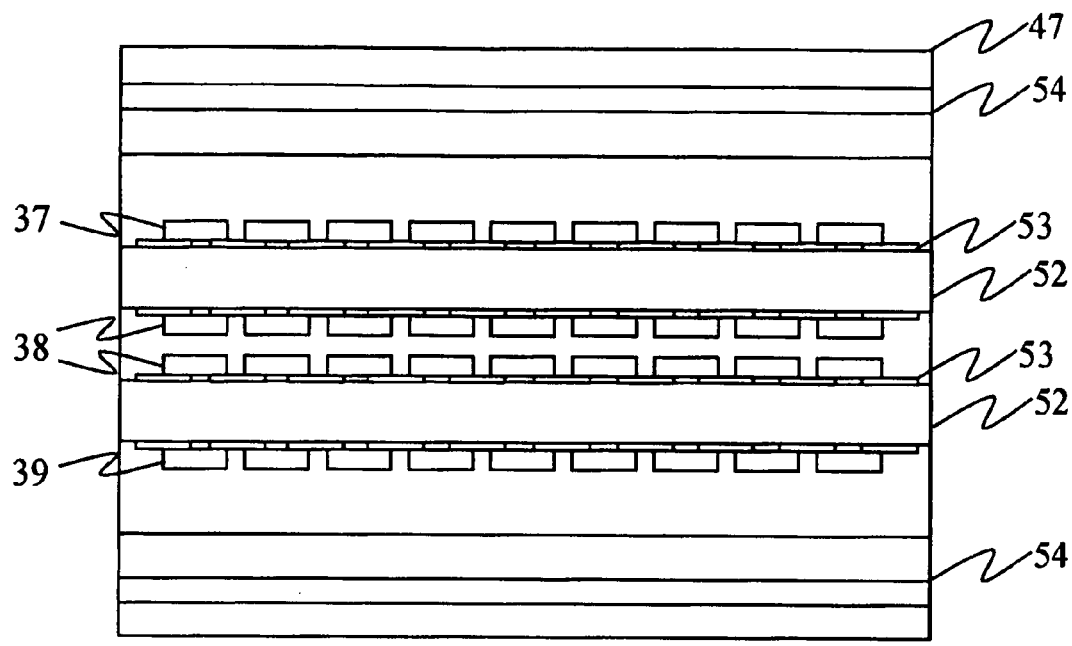
FIG. 21 is a top view of a unit device for mounting the LED elements in the embodiment 4 of the invention.
Figure 22:
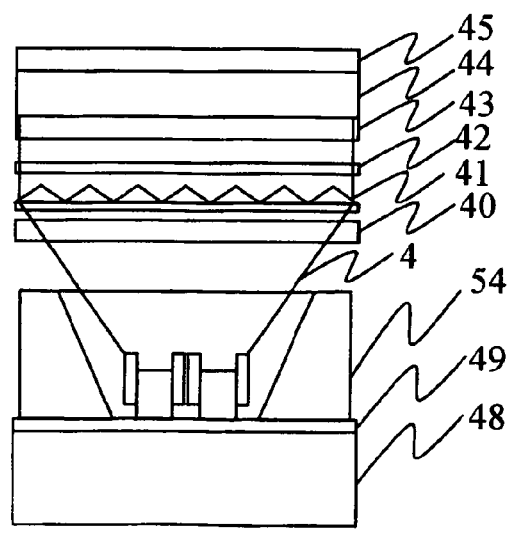
FIG. 22 is a sectional view of the unit device for mounting thereon the LED elements in the embodiment 4 of the invention.
Figure 23:
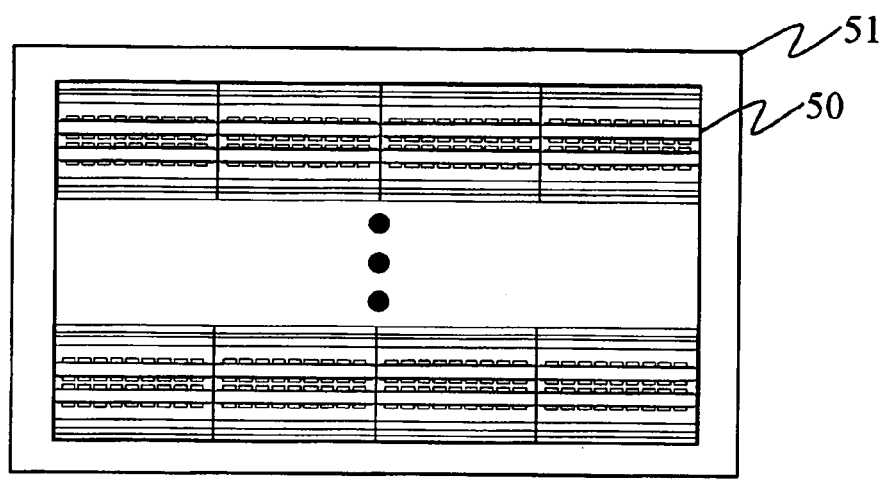
FIG. 23 is a top view of a TV-use LC panel display apparatus with an array of mounting unit devices in the embodiment 4 of the invention.

An embodiment 4 of the invention will be explained using FIGS. 20 to 23 below. FIG. 20 is a top view of a structure for mounting, on a sub-mount, LED elements of the embodiment 4. FIG. 21 is a top view of a unit device for mounting thereon the LEDs of the embodiment 4. FIG. 22 is a sectional view of the unit device for mounting the LEDs of the embodiment 4. FIG. 23 is a top view of a TV-use LC panel display apparatus having a layout of mounting unit devices of the embodiment 4.

While the embodiment 4 performs manufacture and mounting of RGB three-color LED elements in a similar way to that of the embodiment 2 and embodiment 3, the LEDs are laid out and mounted as shown in FIG. 20. Although the mounting is done in a similar way to that of FIG. 15 showing the sectional view, one-color LEDs of the RGB three-color ones are linearly arrayed and mounted on a surface of each of submount members 52 with metal wires 53 railed thereon as shown in FIG. 20. In the case of flip-chip mounting, such mounting may be carried out while using an anisotropic conductive film or paste to provide electrical conductivity between the wires and LEDs.

Optionally in this case, the submount may alternatively be a lead frame or still alternatively be made of a metal, semiconductor or ceramics. Next, as shown in the top view of FIG. 21, this LED arrayed/mounted submount is settled on a corresponding unit substrate 47, followed by mounting of a reflector plate 54 with its length equivalent thereto, resulting in completion of a white light source for use as the backlight.

A state with this white light source mounted as the backlight is shown in FIG. 22. FIG. 22 shows, in cross-section, an example of the case where the white light source unit substrate 47 is mounted on a base made up of a unit-use metal substrate 48 and its overlying dielectric sheet 49 with wires railed thereon. The other optical arrangements are identically the same as those of FIG. 10 or FIG. 13. As shown in FIG. 23, RGB three-color LEDs-mounted unit substrates 47 are laid out in a manner adaptable for use as a backlight in each size of TV-use LCD panel. In this case, a backlight luminous source plate 50 on which the RGB three-color LED unit substrates 47 are densely disposed thereon is capable of achieving uniform illumination over a large area of TV-use LCD panel 51 through a diffuser plate. Changing the number and layout of the unit substrates 47 makes it possible to attain usability as the backlight luminous source in various sizes of TV-use LCD panels. This embodiment also offers, as the backlight for use in TV-use LCD panels, similar effects to those of the embodiments 2 and 3.

Embodiment 5

Figure 24:
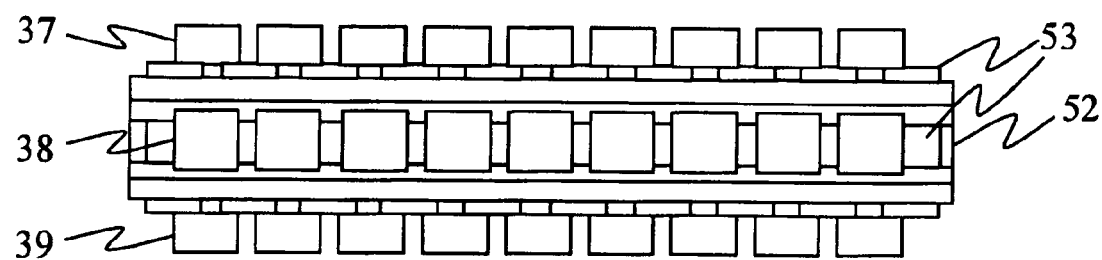
FIG. 24 is a top view of a structure for mounting on a submount LED elements in an embodiment 5 of the invention.
Figure 25:
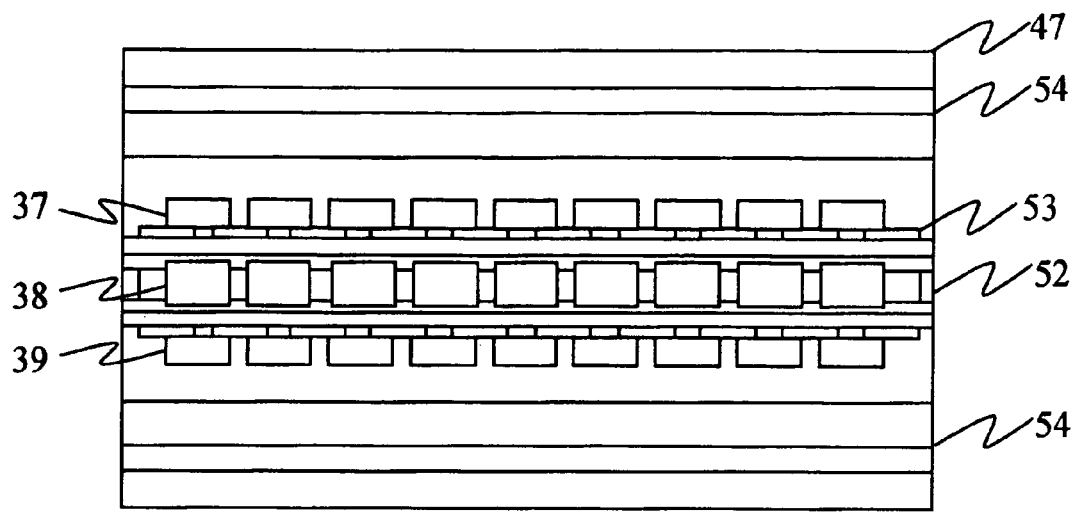
FIG. 25 is a plan view of a unit device for mounting the LED elements in the embodiment 5 of the invention.
Figure 26:
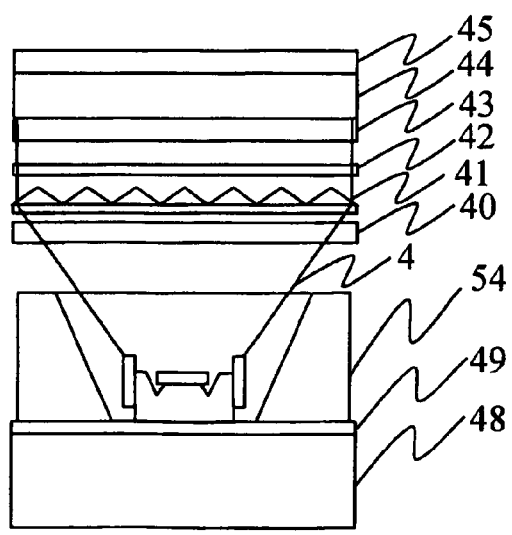
FIG. 26 is a sectional view of a unit device for mounting the LED elements in the embodiment 5 of the invention.
Figure 27:
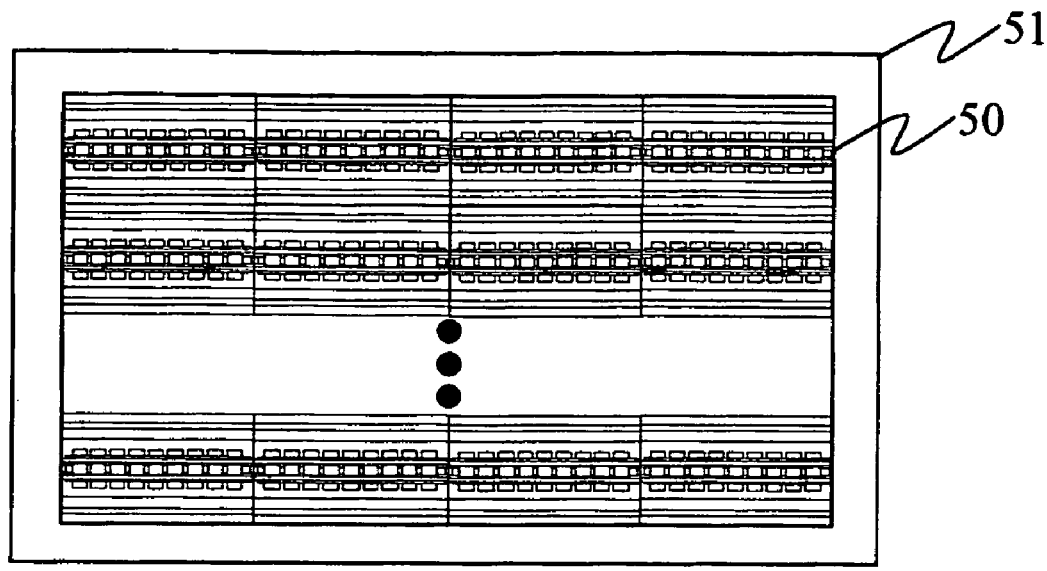
FIG. 27 is a top view of a TV-use LC panel display apparatus with a layout of mounting unit devices in the embodiment 5 of the invention.

An embodiment 5 of the invention will be explained using FIGS. 24 to 27 below. FIG. 24 is a top view of a structure for mounting, on a submount, LED elements of the embodiment 5. FIG. 25 is a top view of a unit device for mounting thereon the LEDs of the embodiment 5. FIG. 26 is a sectional view of the unit device for mounting the LEDs of the embodiment 5. FIG. 27 is a top view of a TV-use LC panel display apparatus having a layout of mounting unit devices of the embodiment 5.

Although the embodiment 5 is arranged to manufacture and mount RGB three-color LED elements in a similar way to that of the embodiment 2, 3 or 4, the LEDs are put in place and mounted as shown in FIG. 24. While the mounting is done in a similar way to that of FIG. 15 showing the sectional view, LEDs of one color out of the RGB three colors are linearly arrayed and mounted on respective three surfaces of a submount member 52 with metal wires 53 railed thereon while also using a cut-out surface of the submount as shown in FIG. 24. A surface corresponding to the upper face of the submount is provided with inclined surfaces on its both sides as shown in the sectional view of FIG. 26, which are for use as reflection planes.

Whereby, at the LEDs as mounted on the upper surface of the submount, outgoing light that was given off from its end face is reflected from a reflection plane to rise up so that polarized light components are irradiated onto the upper surface with respect to the RGB three-color LEDs while letting the polarization direction be secured. In the event of flip-chip mounting, an anisotropic conductive film or paste is used for the mounting while establishing electrical conduction between wires and LEDs. In this case, the submount may be a lead frame or, alternatively, be made of a metal or semiconductor or ceramics.

Next, as shown in the top view of FIG. 25, this arrayed/mounted submount is settled on a unit substrate 47, followed by mounting of a reflector plate 54 having an equivalent length to thereby complete a backlight-use white light source unit. This white light source unit is shown as a backlight in FIG. 26. For example, a cross-sectional view is shown in case the white light source unit substrate 47 is mounted to overlie a unit-use metal substrate 48 and a dielectric sheet 49 with wires railed thereon. The remaining optical arrangements are identically the same as those of FIGS. 10, 13 and 22.

In FIG. 27, there is shown a case where unit substrates 47 each having built-in RGB three-color LEDs are laid out side-by-side to match with each size of TV-use LCD panel, for functioning as a backlight thereof. In this case, a backlight source plate 50 with the RGB three-color LED unit substrates 47 disposed in rows and columns is capable of uniformly illuminating a TV-use LCD panel 51 over a large screen area through a diffuser plate. Changing the number and layout of the unit substrates 47 makes it possible to permit the backlight source to be adaptable for use in various sizes of TV-use LCD panels. In this embodiment also, there are similar effects, as the backlight for TV-use LCD panels, to those of the embodiments 2, 3 and 4 stated supra.

Embodiment 6

Figure 28:
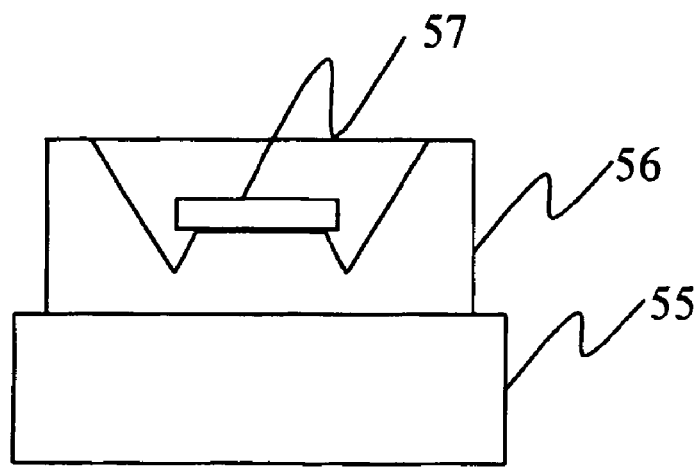
FIG. 28 is a sectional view of a structure for mounting on a reflector plate LED elements in an embodiment 6 of the invention.
Figure 29:
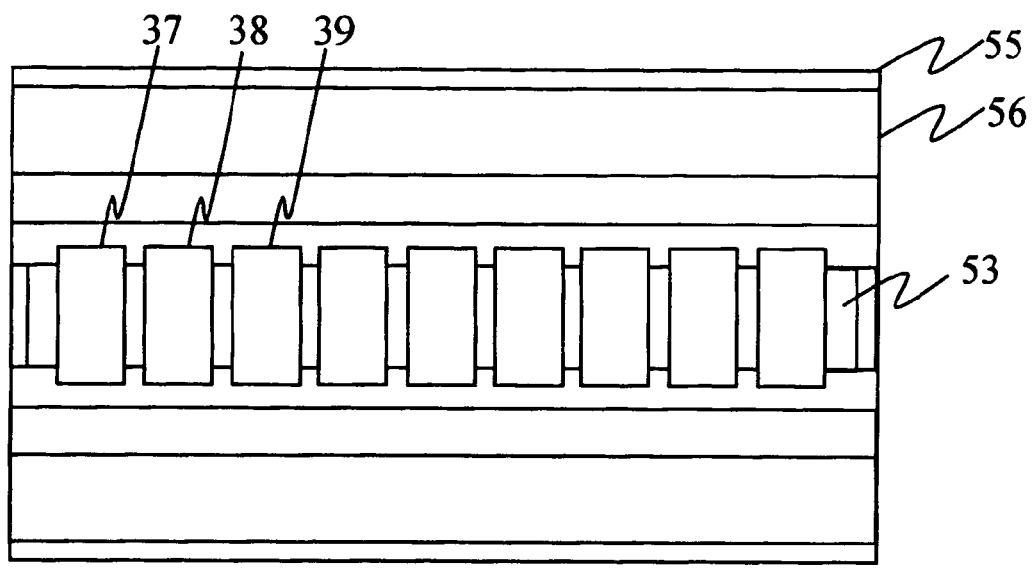
FIG. 29 is a top view of a unit device for mounting the LED elements in the embodiment 6 of the invention.
Figure 30:
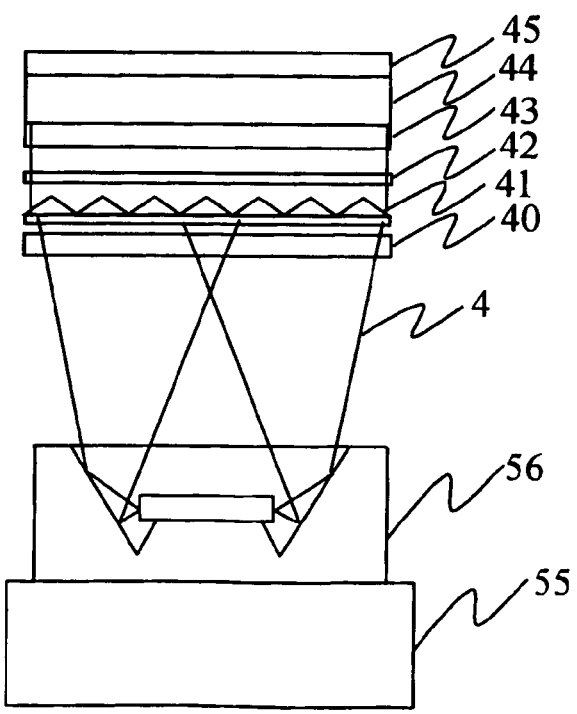
FIG. 30 is a sectional view of the unit device for mounting the LED elements in the embodiment 6 of the invention.
Figure 31:
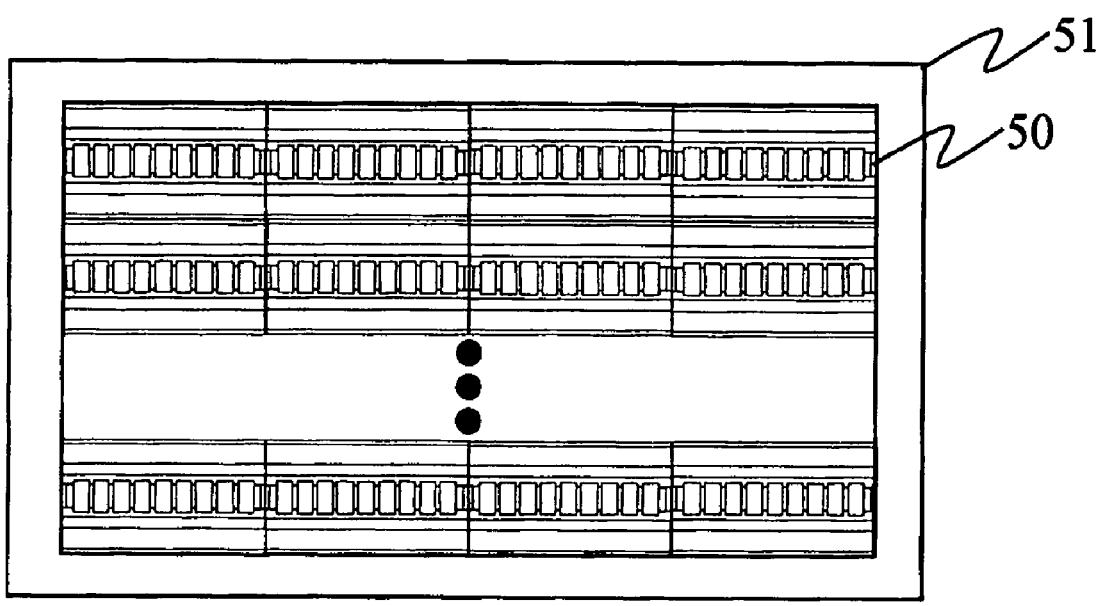
FIG. 31 is a top view of a TV-use LC panel display apparatus with a layout of mounting unit devices in the embodiment 6 of the invention.

An embodiment 6 of the invention will be set forth below. FIG. 28 is a cross-sectional view of a structure for mounting, on a reflection plate, LED elements of the embodiment 6. FIG. 29 is a top view of a unit device for mounting thereon the LEDs of the embodiment 6. FIG. 30 is a sectional view of the unit device for mounting the LEDs of the embodiment 6. FIG. 31 is a top view of a TV-use LC panel display apparatus having a layout of rows and columns of mounting unit devices of the embodiment 6.

While the embodiment 6 performs fabrication and mounting of RGB three-color LED elements in a similar way to that of the embodiment 2, 3, 4 or 5, the LEDs 57 are arrayed and mounted on a central pedestal with a reflector plate 56 formed on a metal substrate 55 as shown in the sectional diagram of FIG. 28. In the case of flip-chip mounting, the mounting is achievable while retaining electrical conduction between wires and LEDs by use of an anisotropic conductive film or plate. As shown in FIG. 28, slanted faces are provided on the both sides for use as reflection planes, whereby the outgoing light as given off from end faces of the mounted LEDs are reflected to rise up so that polarized light components are irradiated onto an upper surface while assuring the polarization direction with respect to all of the RGB three-color LEDs.

As shown in FIG. 29 of the top view diagram, respective RGB three-color LEDs 37-39 are arrayed and mounted on a reflector plate 55 with metal wires 53 formed thereon. Let it be mounted on a unit substrate 47, followed by mounting of a reflector plate 54 having its length corresponding thereto, thereby completing the intended white light source for use as a backlight.

This white light source unit is shown as the backlight in FIG. 30. Here, for example, a cross-sectional view is shown in case the white light source unit 47 with built-in RGB three-color LEDs is mounted on a reflector plate 56 as provided to overlie a unit-use metal substrate 55. The other optical arrangements are identically the same as those of FIGS. 10 and 13 or FIGS. 22 and 26. In FIG. 31, there is shown a case where unit substrates 47 each having built-in RGB three-color LEDs are laid out side-by-side to become well suited for each size of TV-use LCD panel, for functioning as the backlight thereof.

In this case, a backlight luminous source plate 50 with the RGB three-color LED unit substrates 47 arrayed in rows and columns is capable of uniformly illuminating a TV-use LCD panel 51 over a large screen area through a diffuser plate. Changing the number and layout of the unit substrates 47 makes it possible to permit the backlight source to be adaptable for use in various sizes of TV-use LC panels.

In the embodiment 6 also, there are similar effects, as the backlight for TV-use LCD panels, to those of the embodiment 2, 3, 4, or 5. Furthermore, when the reflector plate 56 is formed by a Si substrate, it is possible to attain monolithic integration with light receiving elements for use as optical detectors. It is also possible to achieve monolithic integration with LED driver circuitry and optical detection circuitry of the light receiving elements. This enables it to become thinner and lighter than prior art LED mounting schemes. It is also advantageous for further reduction of power consumption and higher heat releasability.

This invention is effectively adaptable for use as a backlight luminous source in LC panel display apparatus for large-screen TV receivers and also in middle/small-screen LC panel display apparatus for mobile cellular phones and personal computers or equivalents thereto.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A light emission device including a light emitting diode element for use as a backlight luminous source in a liquid crystal panel display apparatus comprising a pair of substrates, a liquid crystal layer disposed between said pair of substrates and a polarization plate, wherein said light emitting diode element includes a substrate having first and second in-plane directions, each parallel to a main surface of said substrate and perpendicular to each other, a light emissive layer formed over said substrate and having a main surface which is parallel to the main surface of the substrate, and a waveguide for outputting light from said light emissive layer, said waveguide including a bottom main surface facing said main surface of said light emissive layer, an upper main surface opposite to and parallel to said lower main surface, first and second side portions, perpendicular to said upper and lower main surfaces and located between said upper and lower main surfaces, said first and second side portions extending in said first in-plane direction of said substrate, and said waveguide further including first and second end faces, perpendicular to said upper and lower main surfaces and located between said upper and lower main surfaces, said first and second end faces each extending in said second in-plane direction of said substrate, wherein said first end face of said waveguide is coated with a low reflective film to permit outputting of light from said light emissive layer and wherein said second end face of said wave guide is coated with a high reflective film for reflecting light from said light emissive layer to said first end face of said waveguide for outputting of said light from said light emitting diode element, wherein outgoing light from said light emissive layer is linearly polarized in advance, and wherein outgoing light from said light emissive layer is output from said waveguide in said first in-plane direction of said substrate through said first end face of said waveguide in a parallel direction with the main surface of said light emissive layer, said light emitting diode element including therein the waveguide arranged for outputting from said first end face, said first in-plane direction of the substrate, polarized light components from said light emissive layer to thereby permit parallel incidence with respect to a polarized light transmission direction of the polarization plate of said liquid crystal panel, said light emitting diode element including a first buried layer and a second buried layer respectively extending over said first and second side portions of said waveguide along the first in-plane direction, and said light emitting diode element having the waveguide included therein is mounted and arranged so that the polarized light transmission direction of the polarization plate of said liquid crystal panel is identical to a polarization direction through an optical system.

2. The light emission device for use as the backlight luminous source of the liquid crystal panel display apparatus according to claim 1, wherein, in the liquid crystal panel display apparatus arranged to comprise a light source having a light emissive layer, optical components including an optical film and an optical plate plus a light guide plate, and the polarization plate, said light source comprises said light emitting diode element having at least one light guide layer, wherein outgoing light from said light emissive layer is polarized in a vertical direction to its output direction and also polarized in a parallel direction with the light emissive layer main surface, wherein the waveguide is arranged for guiding polarized light components from said light emitting diode element to output only in said first in-plane direction while having an arrangement of the waveguide for causing the polarized light components to selectively output from the first and second opposing end faces of said light emitting diode element or one end face thereof, and wherein the mounting of said light emitting diode element and the optical system are arranged to allow the polarized light components as output from said light source to enter in parallel with the polarized light transmission direction of the polarization plate of said liquid crystal panel.

3. The light emission device for use as the backlight luminous source of the liquid crystal panel display apparatus according to claim 2, wherein, in the liquid crystal panel display apparatus comprising the light source having the light emission layer, optical components including the optical film and the optical plate plus the light guide plate and the polarization plate, said light source comprises said light emitting diode element having at least one light guide layer, wherein the outgoing light from said light emissive layer is strongly polarized in the direction perpendicular to its output direction and in the parallel direction with the light emissive layer main surface, wherein the waveguide is arranged for causing polarized light to output in only said first direction in the parallel direction with the light emissive layer main surface, and wherein, owing to having a polarized light component of a large polarization ratio, the polarization ratio is held at least two times or more even after transmission through a diffusion film or a diffusion plate as provided between said light emitting diode element and said liquid crystal panel.

4. The light emission device for use as the backlight luminous source of the liquid crystal panel display apparatus according to claim 3, wherein, in the liquid crystal panel display apparatus comprising the light source having the light emission layer, optical components including the optical film and the optical plate plus the light guide plate and the polarization plate, said light source comprises said light emitting diode element having said at least one light guide layer, wherein a quantum well layer with compressive distortion introduced thereinto is arranged in said light emissive layer, wherein the outgoing light from said light emissive layer is strongly polarized in the direction perpendicular to its output direction and in the parallel direction with the light emissive layer main surface, wherein the waveguide is arranged for causing polarized light to output in only the first direction in the parallel direction with the light emissive layer main surface, and wherein, owing to having a polarized light component of a large polarization ratio, at least twice or more of the polarization ratio is retained even after transmission through a diffusion film or a diffusion plate as provided between said light emitting diode element and said liquid crystal panel.

5. The light emission device according to claim 1, wherein said reflective films at the both end faces have their reflectivity set to adjust in intensity the polarized light leaving the both end faces, thereby providing setup for causing polarized light of equivalent intensity to output from the both end faces or alternatively causing polarized light of large optical intensity to selectively output from an end face on one side.

6. The light emission device according to claim 5, wherein said light emitting device further comprises at least one light guide layer for forcing light to propagate only in a direction in which said waveguide is formed, wherein said waveguide is set to permit polarized light to output from the both end faces or output from said first end face, and wherein said first end face has a curved shape of a concave plane or a convex plane.

7. The light emission device according to claim 6, wherein said light emitting diode element further comprises at least one light guide layer, wherein said waveguide with an asymmetric waveguide width is arranged to permit propagation of light only in said first direction in which said waveguide is formed, wherein said waveguide is set to force polarized light of large intensity to output from a said first end face with a wide waveguide width, and wherein said first end face being wide in waveguide width is of a curved shape of a convex plane whereas said second end face with a narrow waveguide width has a curved shape of a concave plane.

8. The light emission device according to claim 1, wherein, in a combination of said light emission device with strong polarization and a polarization plate of liquid crystal panel, said polarization plate comprises a coated polarization plate with a polymer polarizer film being formed thereon by coating techniques, and wherein said light emission device has an arrangement for enabling establishment of a polarization ratio of at least 5000 to 1 or greater at the liquid crystal panel by causing polarized light components of said light emission device to penetrate in the polarized light transmission direction of said coated polarization plate.

9. The light emission device according to claim 1, wherein said light emitting diode element for output of polarized light is mounted on a lead frame being provided as electrical wires above said substrate.

10. The light emission device according to claim 9, wherein said light emitting diode element for output of polarized light is mounted with an anisotropic conductive film or an isotropic conductive paste being interposed between itself and said lead frame, and wherein mounting is done to ensure that electrical conduction is held between it and the lead frame having a wiring pattern opposing electrodes of said light emitting diode element while retaining dielectricity between the electrodes of said light emitting diode element and between patterns of said lead frame.

11. The light emission device according to claim 10, wherein said light emitting diode element for output of polarized light is flip-chip mounted with respect to the lead frame overlying the substrate through an anisotropic conductive film or an isotropic conductive paste.

12. A display apparatus arranged with the light emission device recited in claim 1 as a backlight luminous source of a liquid crystal panel for use in any one of a mobile phone, a personal computer and a television receiver.

13. The light emission device according to claim 1, wherein the first and second buried layers are spaced from one another in a direction transverse to the one direction.

14. The light emission device according to claim 1, wherein the first buried layer extends only over one side portion of said light emissive layer along the one direction and the second buried layer extends only over an opposite side portion of said light emissive layer along the one direction.

15. The light emission device according to claim 1, wherein said first buried layer and said second buried layer are in contact with an electrode located over said first buried layer and said second buried layer.

16. The light emission device according to claim 1, wherein said light emitting diode element comprises an electrode which is separately located from said first buried layer in a direction of a side surface of said first buried layer.

17. The light emission device according to claim 1, wherein said first in-plane direction of said substrate corresponds to a longitudinal direction of a waveguide path of said waveguide, and said second in-plane direction of said substrate corresponds to a traverse direction of said waveguide, perpendicular to said longitudinal direction of said waveguide path.

18. A light emission device including a light emitting diode element for use as a backlight luminous source in a liquid crystal panel display apparatus comprising a pair of substrates, a liquid crystal layer disposed between said pair of substrates and a polarization plate, wherein outgoing light from said light emitting diode element is linearly polarized in advance, a waveguide is arranged for outputting in a one direction polarized light components from said light emitting diode element to thereby permit parallel incidence with respect to a polarized light transmission direction of the polarization plate of said liquid crystal panel, and said light emitting diode element and the waveguide is mounted and arranged so that the polarized light transmission direction of the polarization plate of said liquid crystal panel is identical to a polarization direction through an optical system, and wherein said light emitting diode element and the waveguide for output of polarized light is mounted above a silicon (Si) substrate and arranged so that said Si substrate is provided with a slanted surface or V-like groove whereby it serves also as a reflection surface and further a light receiving element for photo-detection use is integrated on said Si substrate along with monolithic integration of a light emitting diode element drive circuit made up of transistors and a detection circuit of the light receiving element.

* * * * *